(12) United States Patent
Koresawa

(10) Patent No.: US 9,917,277 B2
(45) Date of Patent: Mar. 13, 2018

(54) DISPLAY PANEL AND PRODUCTION METHOD THEREFOR

(71) Applicant: JOLED INC., Chiyoda-ku, Tokyo (JP)

(72) Inventor: Kouhei Koresawa, Kyoto (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 15/301,404

(22) PCT Filed: Apr. 2, 2015

(86) PCT No.: PCT/JP2015/001896
§ 371 (c)(1),
(2) Date: Oct. 3, 2016

(87) PCT Pub. No.: WO2015/151531
PCT Pub. Date: Oct. 8, 2015

(65) Prior Publication Data
US 2017/0110683 A1 Apr. 20, 2017

(30) Foreign Application Priority Data
Apr. 4, 2014 (JP) ................................. 2014-077670

(51) Int. Cl.
*H01L 51/52* (2006.01)
*H01L 27/32* (2006.01)

(52) U.S. Cl.
CPC ........ *H01L 51/5246* (2013.01); *H01L 27/322* (2013.01); *H01L 27/3246* (2013.01);
(Continued)

(58) Field of Classification Search
CPC ............... H01L 51/5246; H01L 27/322; H01L 27/3246; H01L 27/3283; H01L 2227/32; H01L 2227/323
See application file for complete search history.

(56) References Cited

U.S. PATENT DOCUMENTS 5,443,922 A  8/1995 Nishizaki et al.
2002/0158835 A1  10/2002 Kobayashi et al.
(Continued)

FOREIGN PATENT DOCUMENTS

JP      5-163488 A    6/1993
JP    2002-318556 A   10/2002
(Continued)

OTHER PUBLICATIONS

International Search Report in International Patent Application No. PCT/JP2015/001896, dated Jun. 16, 2015.

*Primary Examiner* — Laura Menz
*Assistant Examiner* — Candice Y Chan
(74) *Attorney, Agent, or Firm* — Hauptman Ham, LLP

(57) ABSTRACT

A display panel including an EL panel unit, a CF panel unit, and a sealing resin layer. In the EL panel, a surface of a sealing layer has a non-flat surface as a whole in a Z-axis direction, with recess portions at light-emitting areas corresponding to regions between banks and protrusion portions at non-light-emitting areas corresponding to tops of the banks. $D2<0.90\times D1$ and $S>\{(0.90\times D1)-D2\}\times W$ are satisfied, where D1 (D1(R), D1(G), D1(B)) denotes a distance between the EL panel unit and the CF panel unit at a first recess portion, D2 denotes a distance between the EL panel unit and the CF panel unit at a protrusion portion, W denotes a width of a top of the protrusion portion, and S denotes a cross-sectional area of a second recess portion.

7 Claims, 26 Drawing Sheets

(52) U.S. Cl.
CPC ...... *H01L 27/3283* (2013.01); *H01L 2227/32* (2013.01); *H01L 2227/323* (2013.01)

(56) References Cited

U.S. PATENT DOCUMENTS

| | | |
|---|---|---|
| 2010/0213827 A1 | 8/2010 | Yoshida et al. |
| 2012/0207991 A1 | 8/2012 | Arai et al. |
| 2012/0228603 A1 | 9/2012 | Nakamura |
| 2013/0026907 A1 | 1/2013 | Okumura et al. |
| 2014/0332778 A1 | 11/2014 | Ito |

FOREIGN PATENT DOCUMENTS

| | | |
|---|---|---|
| JP | 2008-77860 A | 4/2008 |
| JP | 4540747 B2 | 9/2010 |
| JP | 2011-76760 A | 4/2011 |
| JP | 2014-220121 A | 11/2014 |
| WO | 02/089211 A1 | 11/2002 |
| WO | 2011/027815 A1 | 3/2011 |
| WO | 2011/061789 A1 | 5/2011 |
| WO | 2013/001583 A1 | 1/2013 |

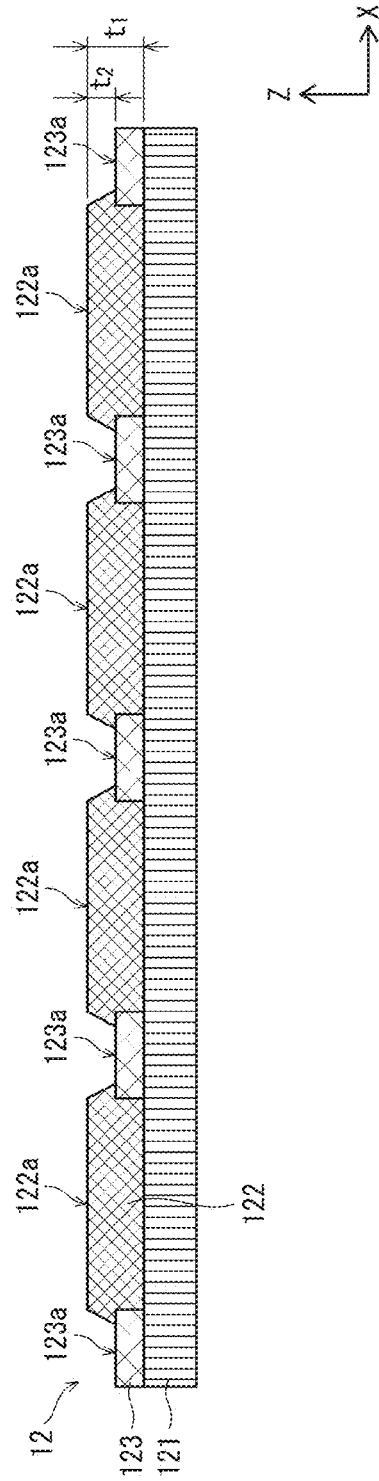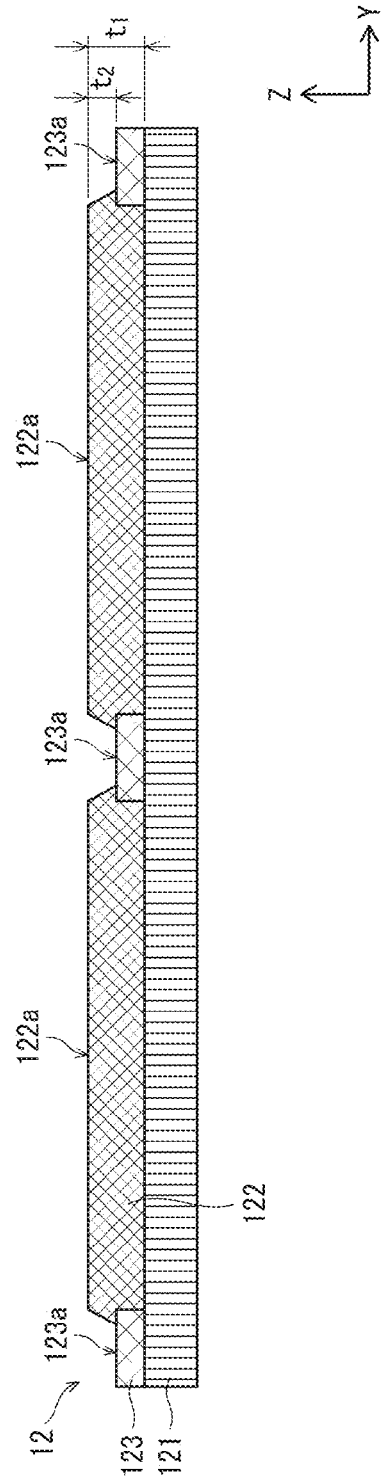

FIG. 9A
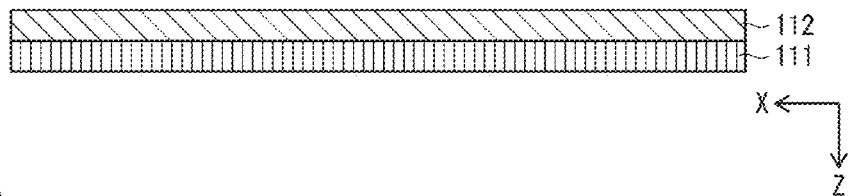
FIG. 9B
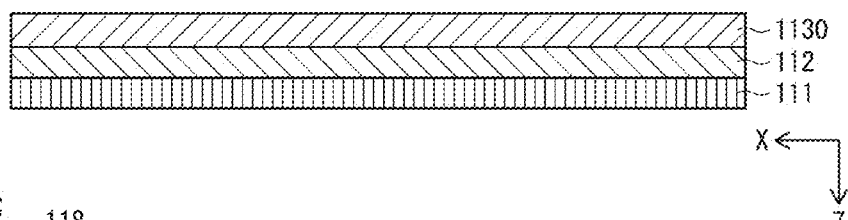
FIG. 9C
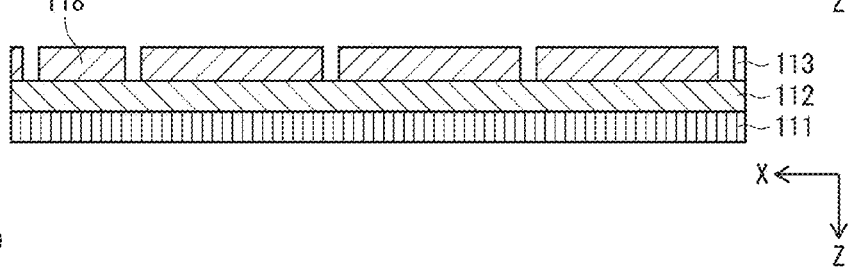
FIG. 9D
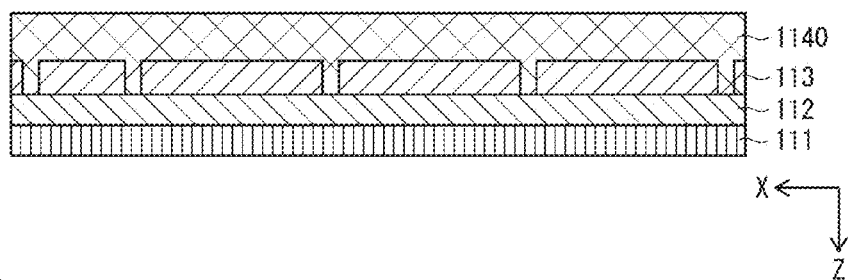
FIG. 9E
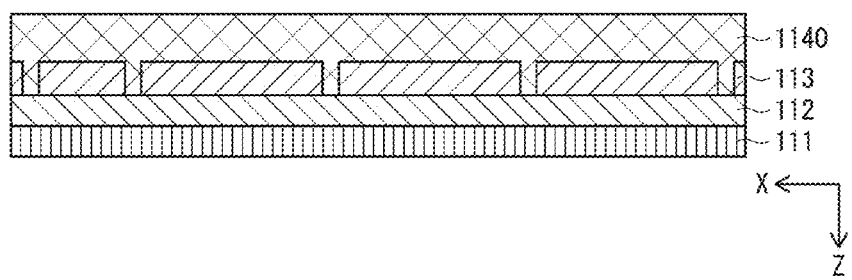

| Sample No. | | No. 1 | No. 2 | No. 3 | No. 4 |
|---|---|---|---|---|---|
| R | [μm] | 1.0 | 1.0 | 1.0 | 1.0 |
| G | [μm] | 1.0 | 1.0 | 1.0 | 1.0 |
| B | [μm] | 1.0 | 1.0 | 1.0 | 1.0 |
| BM | [μm] | 1.0 | 1.0 | 1.0 | 1.0 |
| EL non-flatness level | [μm] | 1.8 | 2.0 | 2.1 | 2.2 |
| D1 (R) | [μm] | 20.0 | 20.0 | 20.0 | 20.0 |
| D1 (G) | [μm] | 20.0 | 20.0 | 20.0 | 20.0 |
| D1 (B) | [μm] | 20.0 | 20.0 | 20.0 | 20.0 |
| D2 | [μm] | 18.2 | 18.0 | 17.9 | 17.8 |
| D2 / D1 | | 91.0 % | 90.0 % | 89.5 % | 89.0 % |

|  | Sample No. 1 | Sample No. 2 | Sample No. 3 | Sample No. 4 |
|---|---|---|---|---|
| Number of sub-pixels in which film detachment occurred | 0 | 0 | 419 | 1530 |
| Percentage of sub-pixels in which film detachment occurred | 0 % | 0 % | 27 % | 99 % |
| Satisfactory / Unsatisfactory | ○ | ○ | × | × |

FIG. 16A
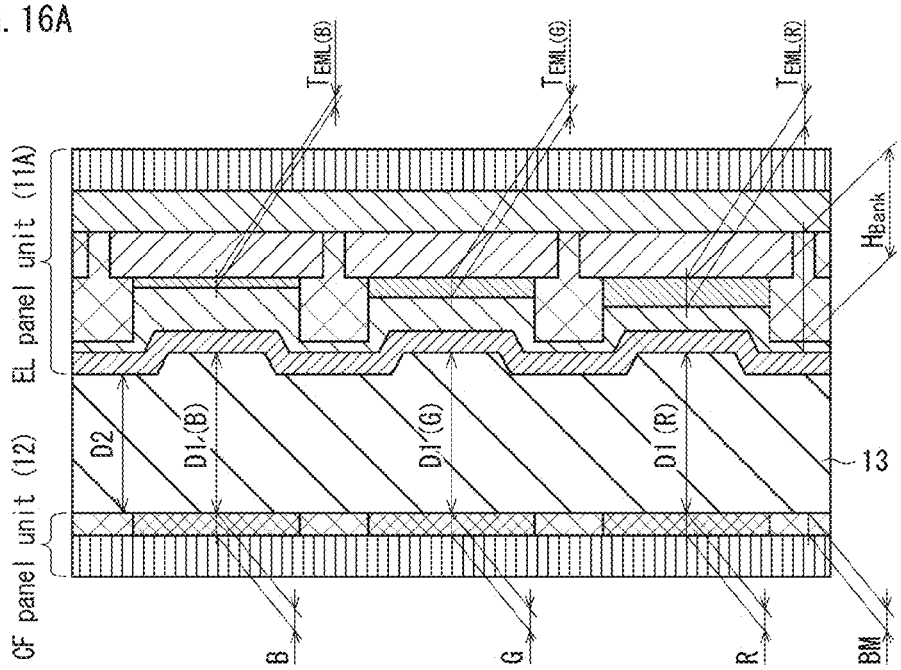
FIG. 16B
| Sample No. | | No. 5 | | |
|---|---|---|---|---|
| Sub-pixel | | B | G | R |
| R | [μm] | 1.0 | 1.0 | 1.0 |
| G | [μm] | 1.0 | 1.0 | 1.0 |
| B | [μm] | 1.0 | 1.0 | 1.0 |
| BM | [μm] | 1.0 | 1.0 | 1.0 |
| Light-emitting layer thickness | [μm] | $T_{EML(B)}$ = 0.15 | $T_{EML(G)}$ = 0.20 | $T_{EML(R)}$ = 0.22 |
| Bank height | [μm] | $H_{Bank}$ = 2.2 | | |
| D1 | [μm] | D1(B) = 20.0 | D1(G) = 19.95 | D1(R) = 19.93 |
| D2 | [μm] | 17.95 | | |
| D2 / D1 | | 89.8 % | 90.0 % | 90.1 % |
FIG. 16C
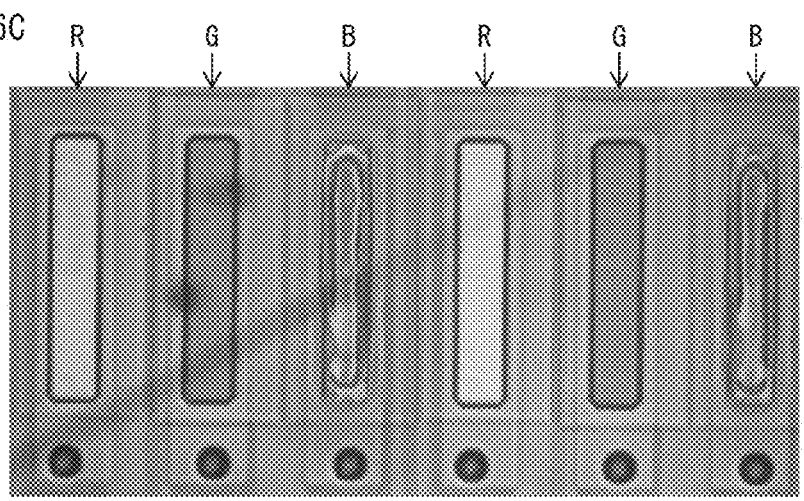

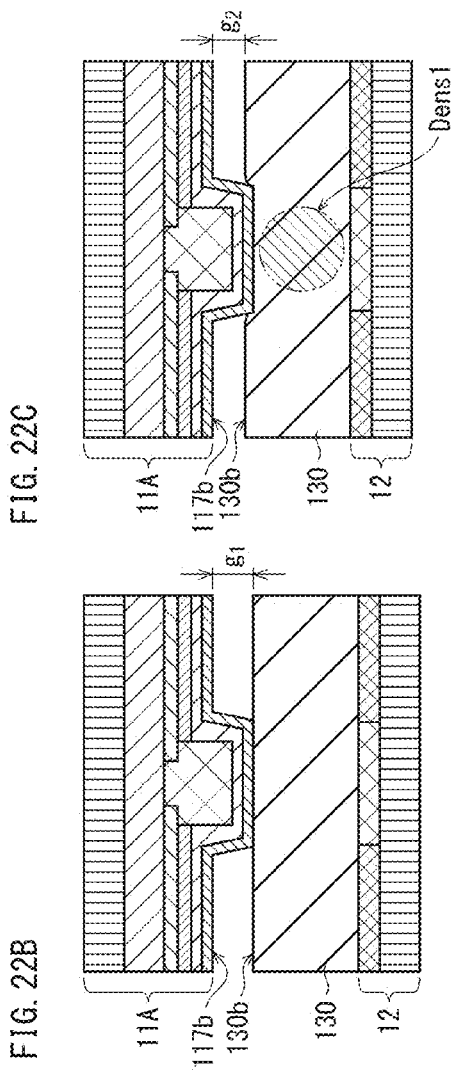
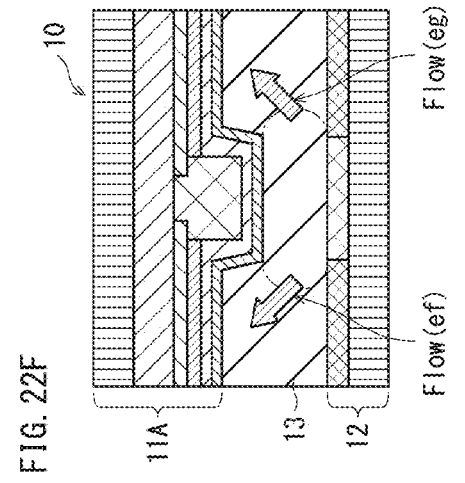
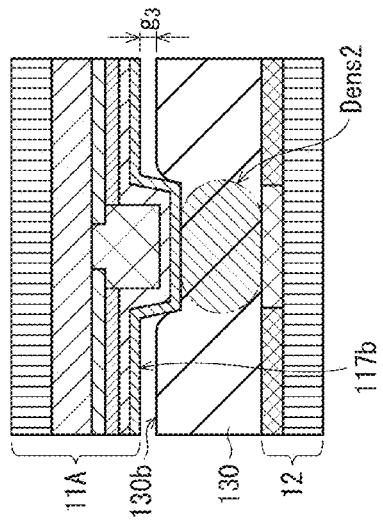

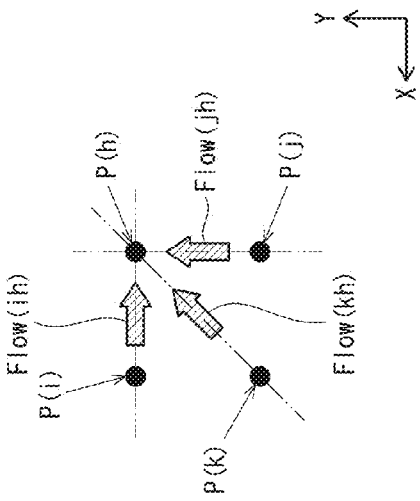
FIG. 23B
FIG. 23C
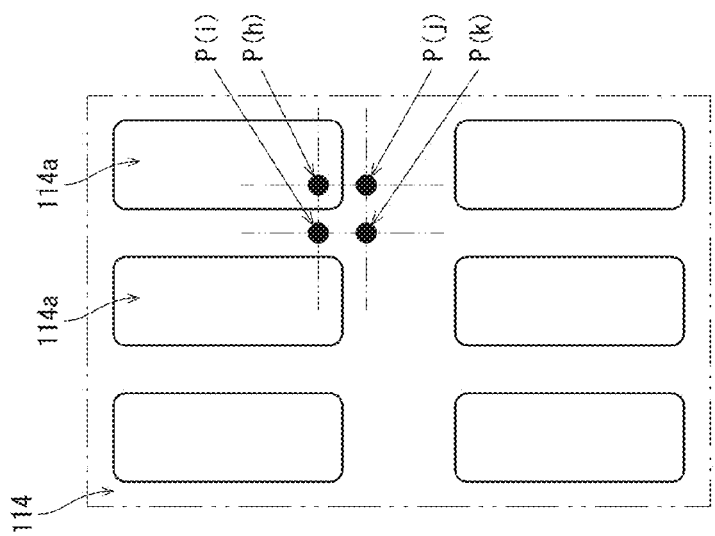
FIG. 23A

FIG. 26
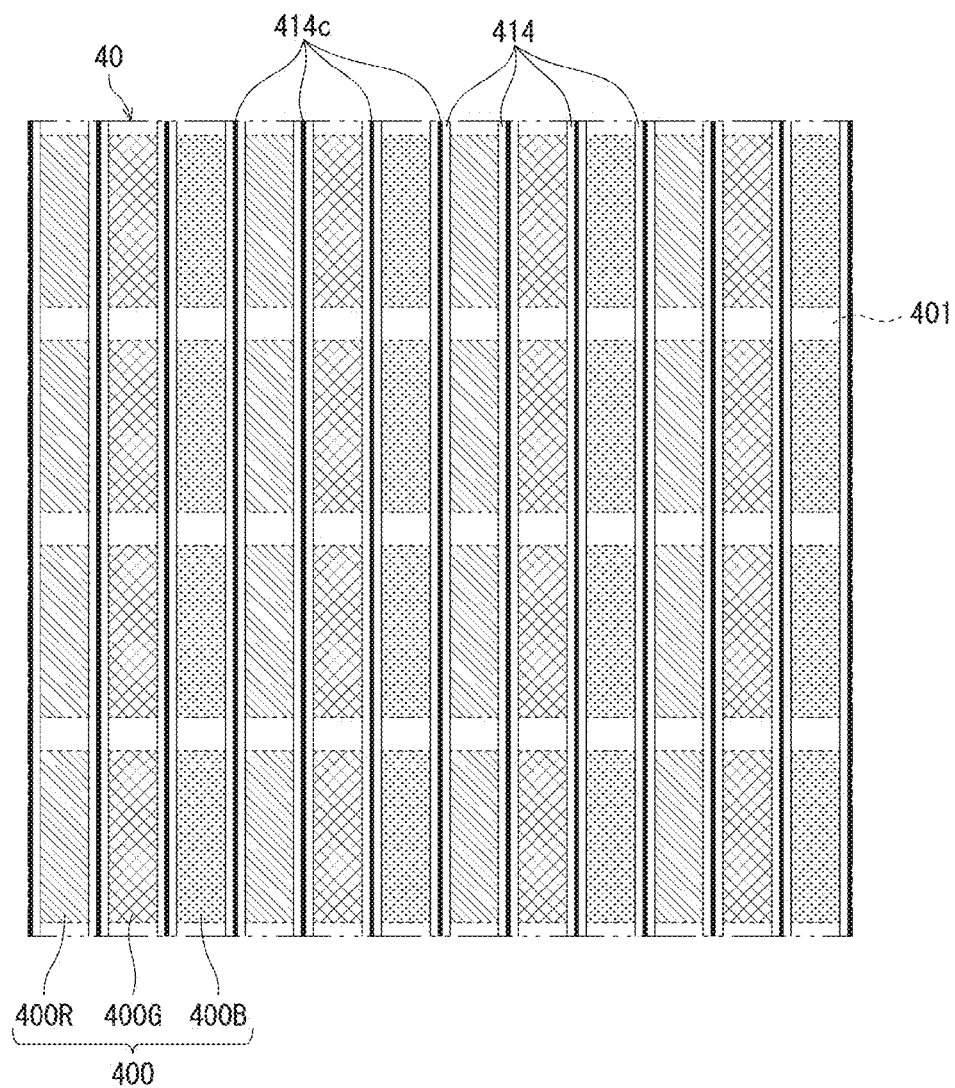
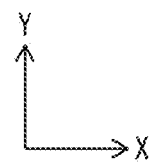

DISPLAY PANEL AND PRODUCTION METHOD THEREFOR

RELATED APPLICATIONS

This application is a National Stage of PCT international application Ser. No. PCT/JP2015/001896, filed on Apr. 2, 2015, which claims priority to Japanese Patent Application No. 2014-077670, filed on Apr. 4, 2014.

TECHNICAL FIELD

The present invention relates to a display panel and a manufacturing method of the same.

BACKGROUND ART

Recently, much study and development is being conducted of organic electroluminescent (EL) display panels, which are display panels using the electroluminescence phenomenon of organic material. Organic EL display panels are advantageous to liquid crystal display panels and the like for having properties such as high-speed response, low power consumption, low thickness and weight, and high contrast, and are receiving much attention as high-performance display panels.

A typical organic EL display panel includes an organic EL panel unit and a color filter (CF) panel unit arranged so as to face each other. The organic EL panel unit is formed by disposing a laminated body formed of anodes, hole-injection layers, hole transport layers, organic light-emitting layers, an electron transport layer, a cathode, and a sealing layer, on a substrate including a thin-film transistor (TFT) layer. In addition, banks dividing organic light-emitting layers in adjacent light-emitting areas from each other are formed on the substrate.

Meanwhile, the CF panel unit includes a substrate, color filter layers on the substrate that respectively correspond to light-emitting areas, and black matrix layers partitioning adjacent color filters from each other.

In the organic EL display panel, the EL panel unit and the CF panel unit are arranged so as to face each other in a manner such that a main surface of the EL panel unit on which the laminated body is formed and a main surface of the CF panel unit on which the color filter layers and the like are formed face each other. Further, the organic EL display panel includes a resin layer interposed between the EL panel unit and the CF panel unit. The resin layer typically has sealing property, for the purpose of preventing intrusion of moisture into the EL panel unit (Patent Literature 1).

In addition, in order to prevent air bubbles from remaining in the resin layer, a technique of forming the resin layer using a non-flowable resin has been proposed (Patent Literature 2). Here, the non-flowable resin is a resin having no flowability in a state where the resin has not been subjected to a process such as heating or light irradiation. The panel units are adhered together using this resin by first adhering the EL panel unit and the CL panel unit together with the non-flowable resin disposed therebetween, then heating the resin or irradiating the resin with light to provide the resin with flowability, and finally curing the resin.

CITATION LIST

Patent Literature

[Patent Literature 1]
Japanese Patent Application Publication No. 2013/001583

[Patent Literature 2]
International Application Publication WO 2011/027815

SUMMARY OF INVENTION

Technical Problem

However, in the technique proposed in Patent Literature 2, after the EL panel unit and the CF panel unit are adhered together, film detachment may occur in the surface of the EL panel unit within the light-emitting areas. Such film detachment may, for example, reduce the luminance of the portion where film detachment has occurred, or put the portion where film detachment has occurred in non-light-emission state.

This problem does not only occur in organic EL display panels, but also similarly occurs in any display panel including two panel units arranged to face each other with a resin layer interposed therebetween. In addition, while the above-described problem is prominent when the resin interposed between the panel units is the non-flowable resin introduced in Patent Literature 2, a similar problem is considered to also occur with other resins allowing resin flow between two panel units to occur.

The present invention is made in order to solve the above-described problem, and one object of the present invention is to provide a display panel having high display quality due to the risk being low of film detachment caused by resin flow occurring in the adhesion of two panel units, and a manufacturing method of the display panel.

Solution to Problem

One aspect of the present invention is a display panel including: a first panel unit (i) including a substrate and a film body disposed on at least a part of one surface of the substrate, (ii) having two main surfaces, one of which including a surface of the film body is referred to as a first main surface, and (ii) including, in plan view, a light-emitting area and a non-light-emitting area disposed next to one another; a second panel unit disposed to face the first main surface with a space therebetween, one main surface of the second panel unit facing the first main surface being referred to as a second main surface; and a sealing resin layer disposed in the space between the first panel unit and the second panel unit and in contact with both the first main surface and the second main surface, wherein the first main surface, as a whole, is a non-flat surface, with a first recess portion corresponding to the light-emitting area, a protrusion portion corresponding to the non-light-emitting area, and a second recess portion disposed in a top part of the protrusion portion, and $D2 < 0.90 \times D1$ and $S > \{(0.90 \times D1) - D2\} \times W$ are satisfied, where $D1$ denotes a distance between a bottom surface of the first recess portion and the second main surface; $D2$ denotes a distance between a top surface of the protrusion portion and the second main surface; $W$ denotes a width of the top surface of the protrusion portion in one direction in which the light-emitting area and the non-light emitting area are disposed next to one another; and $S$ denotes an area of a cross-section of the second recess portion taken along a plane defined by the one direction and a direction perpendicular to the first main surface.

Advantageous Effects of Invention

The display panel pertaining to one aspect of the present invention has high display quality due to the risk being low of film detachment caused by resin flow occurring in the adhesion of the first panel unit and the second panel unit.

BRIEF DESCRIPTION OF DRAWINGS

FIGS. 6A and 6B are schematic cross-sectional views each illustrating a configuration of the CF panel unit 12 of the display panel 10, with FIG. 6A being a schematic cross-sectional view taken along line C1-C2 in FIG. 5 and FIG. 6B being a schematic cross-sectional view taken along line E1-E2 in FIG. 2.

FIGS. 9A to 9E are schematic views illustrating production processes of the EL panel unit 11.

FIG. 16A is a schematic cross-sectional view illustrating a configuration of display panel sample No. 5, FIG. 16B is a table illustrating dimensions of sub-pixels, and FIG. 16C is a view showing sub-pixels of sample No. 5.

FIGS. 22A to 22F are schematic cross-sectional views illustrating resin density distribution and resin flow in each process between adhesion and resin curing.

FIG. 23A is a schematic plan view illustrating a positional relation among points P(h), P(i), P(j), and P(k) on the banks 114, FIG. 23B is a schematic cross-sectional view at positions of points P(h), P(i), P(j), and P(k), and FIG. 23C is a schematic view illustrating directions of resin flow from points P(i), P(j), and P(k) to point P(h).

FIG. 26 is a schematic plan view illustrating a pixel configuration in a display panel 40 according to a modification.

DESCRIPTION OF EMBODIMENTS

Discussion of Occurrence of Film Detachment

Figure 1:
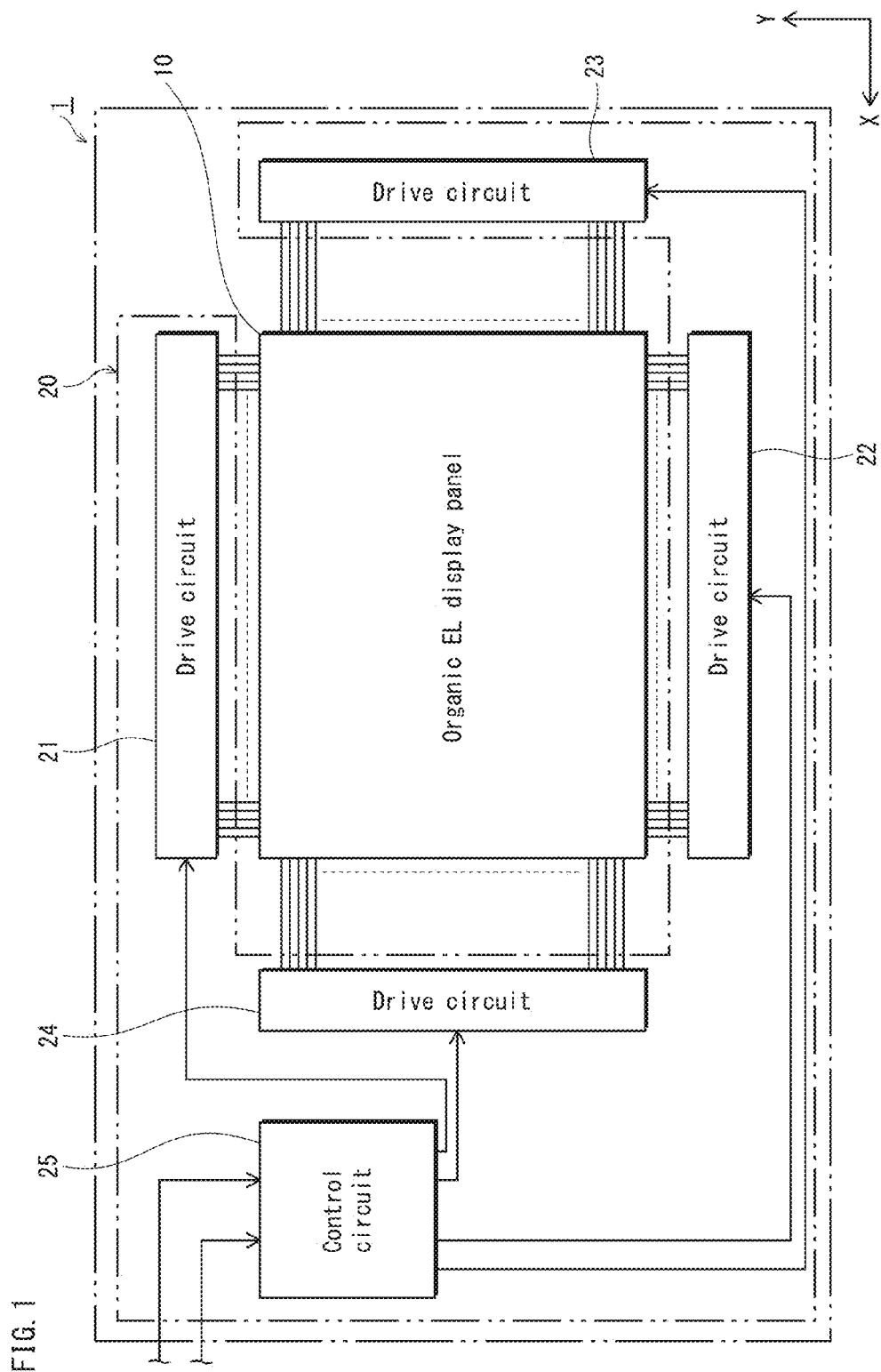
FIG. 1 is a schematic block diagram illustrating a general configuration of a display device 1 according to an embodiment of the present invention.

Adhesion of panel units with the above-described non-flowable resin includes the following processes.

(Process a) Adhering the non-flowable resin (in, for example, a sheet-like state) to one of the panel units (for example, a second panel unit).

(Process b) Adhering the other panel unit (for example, a first panel unit) to the exposed one of main surfaces of the non-flowable resin.

(Process c) Providing the non-flowable resin with flowability by heating the resin or irradiating the resin with light, and then curing the resin, which completes the adhering of the panel units with one another.

By performing (Process a) and (Process b) among the processes described above under a reduced-pressure atmosphere, the non-flowable resin is put in contact with both panel units without any gap between the non-flowable resin and the panel units.

In a typical display panel, a main surface of at least one of the two panel units included in the display panel that faces the other one of the two panel units is a non-flat surface. Therefore, when flowability is provided to the resin in (Process c), resin density varies from area to area between the panel units. Specifically, resin density is higher at areas where the distance between the two panel units is small compared to at areas where the distance between the two panel units is large. This variance in resin density distribution brings about pressure difference between the areas, which results in resin flow from areas where the distance between the two panel units is small to areas where the distance between the two panel units is great.

Such resin flow causes a shear force to be applied to a film body present at a surface of a panel unit facing the other panel unit. For example, when taking an organic EL display panel as an example, the film body receiving the shear force may be a sealing layer, an electrode layer, or an organic EL layer of an EL panel unit. Further, detachment of such film body (referred to in the following as film detachment) is considered to occur when the shear force becomes greater than or equal to a certain level.

Film detachment occurring in a panel unit would directly lead to a decrease in display quality in a display panel. Therefore, in order to ensure that a display panel has high display quality, it is important to reduce variance in resin density in the adhesion process as much as possible and thereby reduce resin flow in (Process c) as much as possible.

[Aspects of Present Invention]

One aspect of the present invention is a display panel including: a first panel unit (i) including a substrate and a film body disposed on at least a part of one surface of the substrate, (ii) having two main surfaces, one of which including a surface of the film body is referred to as a first main surface, and (ii) including, in plan view, a light-emitting area and a non-light-emitting area disposed next to one another; a second panel unit disposed to face the first main surface with a space therebetween, one main surface of the second panel unit facing the first main surface being referred to as a second main surface; and a sealing resin layer disposed in the space between the first panel unit and the second panel unit and in contact with both the first main surface and the second main surface, wherein the first main surface, as a whole, is a non-flat surface, with a first recess portion corresponding to the light-emitting area, a protrusion portion corresponding to the non-light-emitting area, and a second recess portion disposed in a top part of the protrusion portion, and D2<0.90×D1 and S>{(0.90×D1)−D2}×W are satisfied, where D1 denotes a distance between a bottom surface of the first recess portion and the second main surface; D2 denotes a distance between a top surface of the protrusion portion and the second main surface; W denotes a width of the top surface of the protrusion portion in one direction in which the light-emitting area and the non-light emitting area are disposed next to one another; and S denotes an area of a cross-section of the second recess portion taken along a plane defined by the one direction and a direction perpendicular to the first main surface.

In a specific example of the display panel pertaining to one aspect of the present invention, the second main surface, as a whole, is a non-flat surface, with a top part of a protrusion portion protruding further towards the first panel unit compared to a bottom part of a recess portion.

In a specific example of the display panel pertaining to one aspect of the present invention, the recess portion of the second main surface is located within an area of the second panel unit that, in plan view, corresponds to the non-light-emitting area of the first panel unit.

In a specific example of the display panel pertaining to one aspect of the present invention, the protrusion portion of the second main surface is located within an area of the second panel unit that, in plan view, corresponds to the non-light-emitting area of the first panel unit.

In a specific example of the display panel pertaining to one aspect of the present invention, the second panel unit is a color filter panel including: a substrate; a color filter layer formed on the substrate; and a black matrix layer formed adjacent to the color filter layer.

One aspect of the present invention is a method of manufacturing a display panel that, in one specific example, includes: preparing a first panel unit (i) including a substrate and a film body disposed on at least a part of one surface of the substrate, (ii) having two main surfaces, one of which including a surface of the film body is referred to as a first main surface, and (ii) including, in plan view, a light-emitting area and a non-light-emitting area disposed next to one another; preparing a second panel unit; adhering non-flowable resin onto one main surface of the second panel unit, said one main surface of the second panel unit referred to as a second main surface; adhering the first main surface onto one of main surfaces of the non-flowable resin that is opposite the other one of the main surfaces of the non-flowable resin onto which the second panel unit has been adhered; and forming a sealing resin layer by applying heat or light with respect to the non-flowable resin to yield resin with flowability, and curing the resin with flowability, wherein the first main surface, as a whole, is a non-flat surface, with a first recess portion corresponding to the light-emitting area, a protrusion portion corresponding to the non-light-emitting area, and a second recess portion disposed in a top part of the protrusion portion, the sealing resin layer is in contact with both the first main surface and the second main surface, and D2<0.90×D1 and S>{(0.90×D1)−D2}×W are satisfied, where D1 denotes a distance between a bottom surface of the first recess portion and the second main surface; D2 denotes a distance between a top surface of the protrusion portion and the second main surface; W denotes a width of the top surface of the protrusion portion in one direction in which the light-emitting area and the non-light emitting area are disposed next to one another; and S denotes an area of a cross-section of the second recess portion taken along a plane defined by the one direction and a direction perpendicular to the first main surface.

In one specific example of the method pertaining to one aspect of the present invention, the adhesion of the second main surface and the non-flowable resin and the adhesion of the first main surface and the non-flowable resin are conducted under a reduced-pressure atmosphere, and when having been put in adhesion with the first and second main surfaces, the non-flowable resin is in contact with the entire first main surface, including the top surface of the protruding portion and the bottom surface of the recess portion, and with the entire second main surface.

Embodiment

1. Overall Configuration of Display Device

Figure 2:
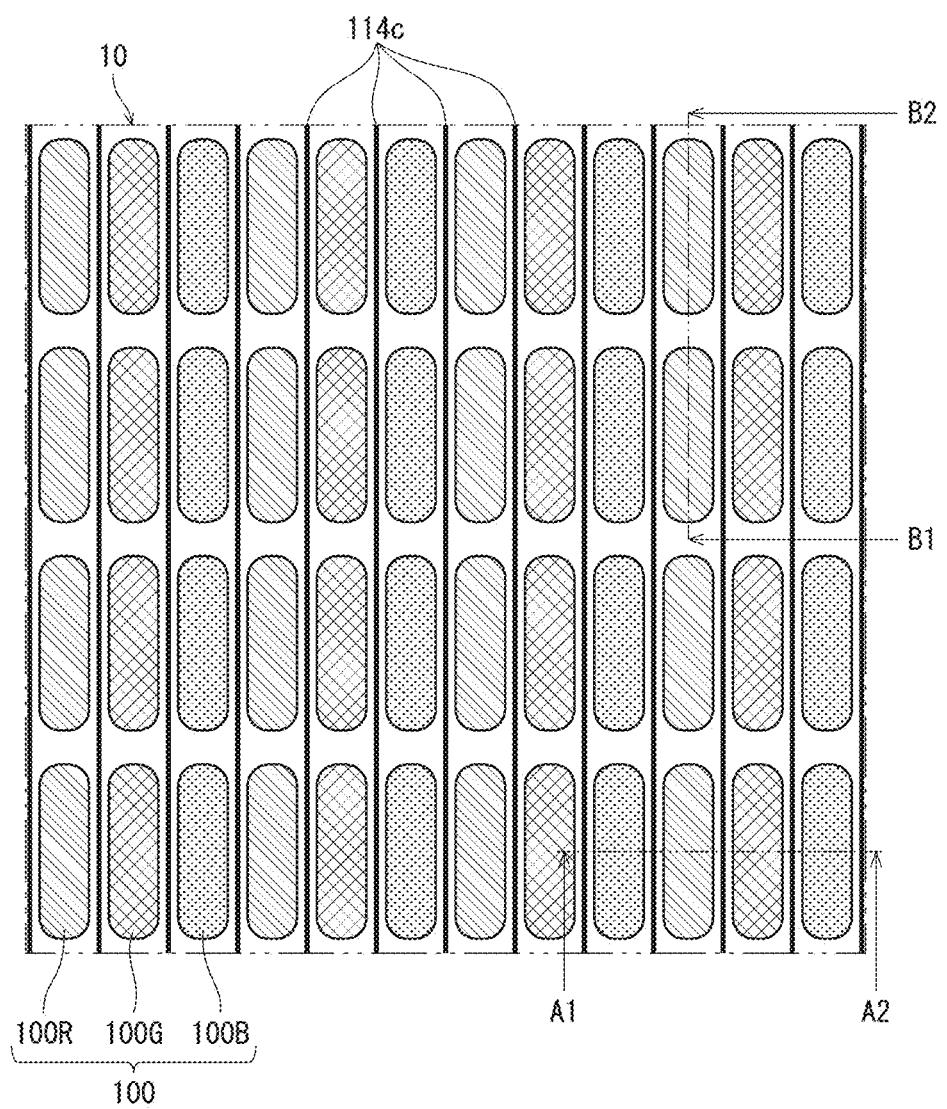
FIG. 2 is a schematic plan view illustrating a pixel configuration in a display panel 10 of the display device 1.

The following describes the overall configuration of a display device 1 pertaining to an embodiment of the present invention, with reference to FIGS. 1 and 2.

As illustrated in FIG. 1, the display device 1 includes an organic EL display panel 10 (referred to as display panel 10 in the following) and a drive control unit 20 connected to the display panel 10. The display panel 10 is a panel using the electroluminescence effect of an organic material, and has a plurality of pixels.

As illustrated in FIG. 2, the display panel 10 has a plurality of sub-pixels 100R, a plurality of sub-pixels 100G, and a plurality of sub-pixels 100B. The sub-pixels are arranged in a two-dimensional arrangement along the X-axis and Y-axis directions. Each set of adjacent sub-pixels 100R, 100G, 100B composes one pixel 100 of the display panel 10.

Referring to FIG. 1 once again, the drive control unit 20 includes four drive circuits, namely drive circuits 21, 22, 23, and 24, and a control circuit 25.

Note that in the display device 1, the display panel 10 and the drive control circuit 20 need not be arranged with respect to one another as illustrated in FIG. 1. Further, the drive control unit 20 need not have the circuit structure illustrated in FIG. 1.

Further, the display panel 10 need not have the pixel structure illustrated in FIG. 2, where each pixel is composed of three sub-pixels of the colors R, G, and B. Alternatively, the display panel 10 may have a pixel structure where each pixel includes sub-pixels for four or more colors.

2. Configuration of Display Panel

The following describes the configuration of the display panel 10, with reference to FIG. 3, FIGS. 4A and 4B, FIG. 5, and FIGS. 6A and 6B.

Figure 3:
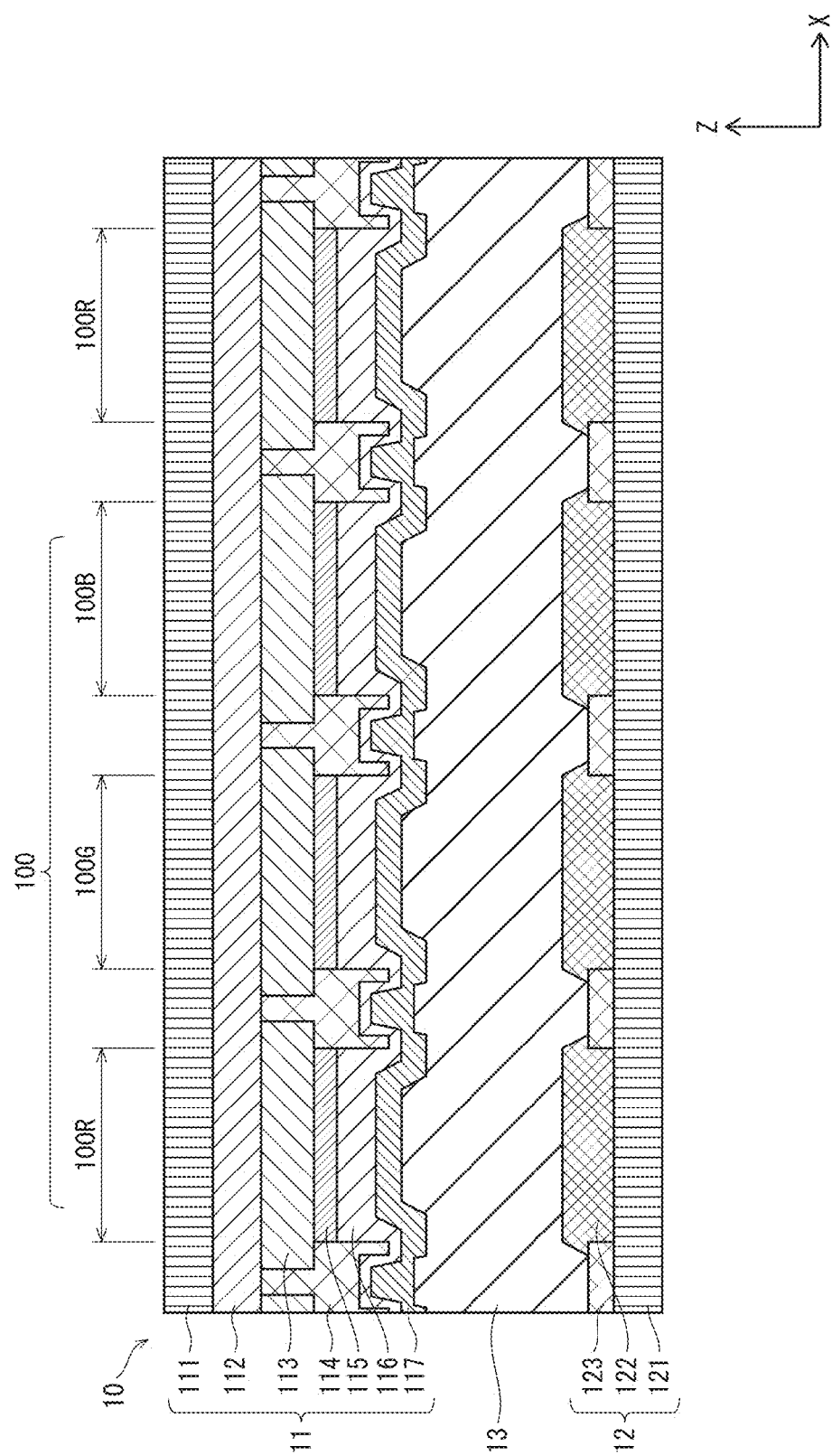
FIG. 3 is a schematic cross-sectional view illustrating a configuration of the display panel 10.

As illustrated in FIG. 3, the display panel 10 includes an EL panel unit 11 and color filter (CF) panel unit 12. The EL panel unit 11 includes a plurality of film bodies, namely film bodies 112, 113, 114, 115, 116, and 117 disposed on a substrate 111. The CF panel unit 12 includes layers 122 and 123 disposed on a substrate 121. The EL panel unit 11 and the CF panel unit 12 are arranged to face each other with a sealing resin layer 13 interposed therebetween.

The sealing resin layer 13 is in contact with a main surface of the EL panel unit 11 that is further downward in the Z-axis direction, and with a main surface of the CF panel unit 12 that is located further upward in the Z-axis direction. The sealing resin layer 13 joins the EL panel unit 11 and the CF panel unit 12 together, and in addition, prevents moisture, air, and/or the like from the outside from intruding into the EL panel unit 11.

(1) Configuration of EL Panel Unit 11

Figure 4:
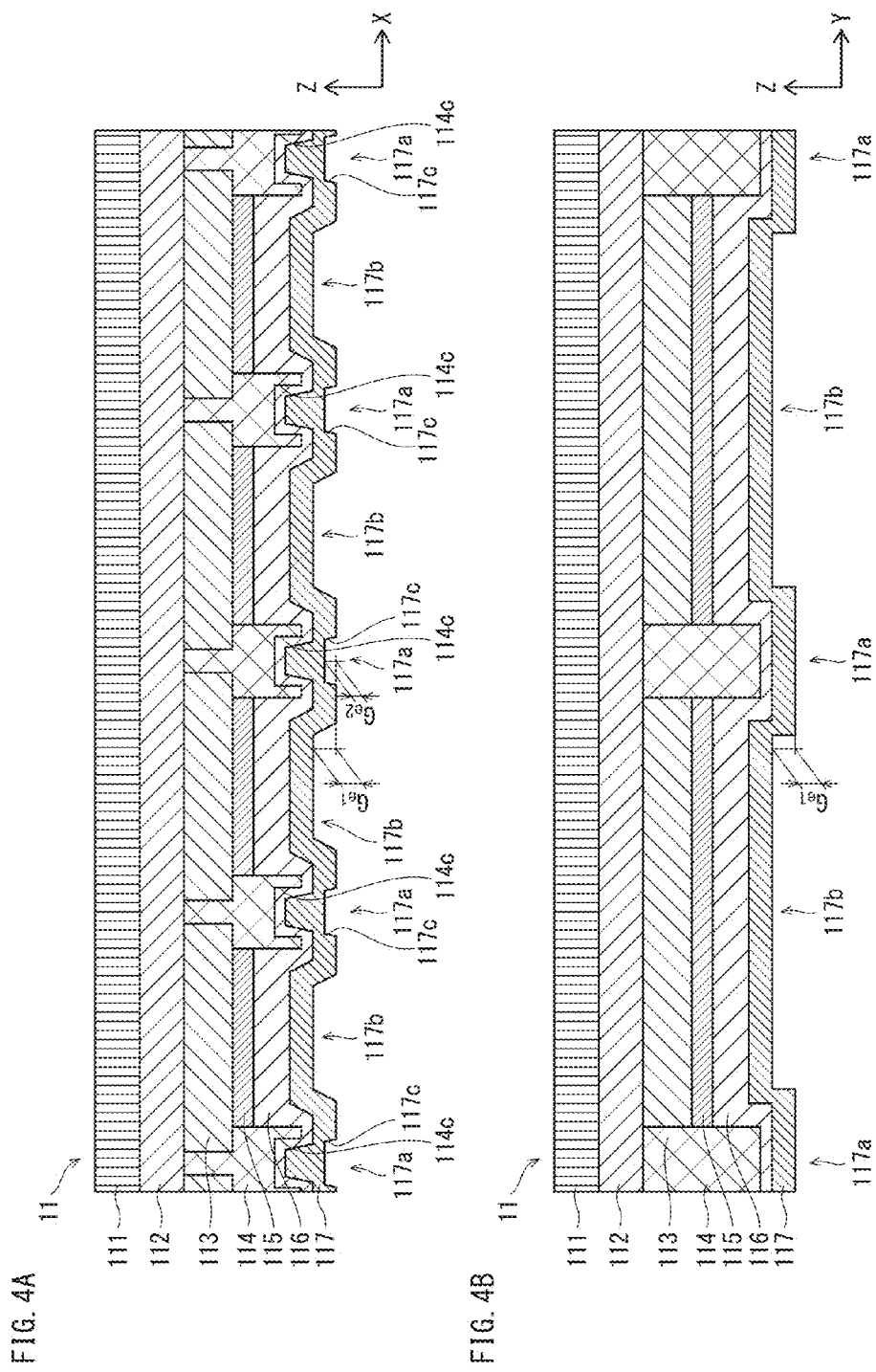
FIGS. 4A and 4B are schematic cross-sectional views each illustrating a configuration of an EL panel unit 11 of the display panel 10, with FIG. 4A being a schematic cross-sectional view taken along line A1-A2 in FIG. 2 and FIG. 4B being a schematic cross-sectional view taken along line B1-B2 in FIG. 2.

As illustrated in FIGS. 4A and 4B, the EL panel unit 11 includes a substrate 111 and an interlayer insulating film 112 disposed on a main surface of the substrate 111 that is further downward in the Z-axis direction. The substrate 111 includes an undepicted TFT layer. The inclusion of the TFT layer 111 results in the substrate 111 having a non-flat surface. The interlayer insulating film 112 provides electrical insulation, and in addition, serves as a planarizing film that reduces or eliminates the influence of the non-flat surface of the substrate 111.

The interlayer insulating film 112 has anodes 113 disposed thereon. The anodes 113 correspond one-to-one with the sub-pixels 100R, 100G, 100B. As illustrated in FIGS. 4A and 4B, each anode 113 is longer in the Y-axis direction than in the X-axis direction.

Each adjacent pair of anodes 113 has a bank 114 disposed therebetween in erected state. That is, a plurality of banks 114 are disposed, and the banks 114 overlap with parts of anodes 113 while surrounding the anodes 113. The banks 114 define openings that become the sub-pixels 100R, 100G, 100B. In FIGS. 4A and 4B, each bank 114 is illustrated to have a cross-sectional shape with vertical lateral surfaces, for the sake of convenience. However, the banks 114 may not have such cross-sectional shapes, and may actually have a cross-sectional shape with inclined lateral surfaces. That is, the banks 114 may have trapezoidal cross-sectional shapes.

In each opening defined by the banks 114, an organic light-emitting layer 115 is disposed on an anode 113. In the present embodiment, the organic light-emitting layers 115 included in the sub-pixels 100R, 100G, 100B emit light of a wavelength region corresponding to sub-pixel color. In addition, the banks 114 have dents 114c formed at surface portions thereof. The bottoms of the dents 114c are concave upward in the Z-axis direction. Further, the dents 114c extend in the Y-axis direction. The function of the dents 114c is described later in the present disclosure.

Note that the present embodiment is based on an exemplary configuration where the anodes 113 and the organic light-emitting layers 115 are in contact with each other. However, hole injection layers, hole transport layers, and/or the like may be disposed between the anodes 113 and the organic light-emitting layers 115.

Above the organic light-emitting layers 115, a cathode 116 and a sealing layer 117 are disposed in the stated order. The cathode 116 and the sealing layer 117 each extend continuously across the entire EL panel unit 11, and each cover the tops of the banks 114. Therefore, the surface of the sealing layer 117 includes protrusion portions 117a and first recess portions 117b. Each protrusion portion 117a corresponds to a top of one bank 114, and is convex downward in the Z-axis direction. Each first recess portion 117b corresponds to a portion between banks 114, and is concave upward in the Z-axis direction. Further, each protrusion portion 117a has, at a top thereof, a second recess portion 117c. This is due to the cathode 116 and the second layer 117 each having portions sinking into the dents 114c, which are formed at surfaces of the banks 114. Thus, when viewing the surface of the sealing layer 117, or in other words, the lower surface of the EL panel unit 11 in the Z-axis direction, the surface is a non-flat surface as a whole. In other words, the lower surface of the EL panel unit 11 in the Z-axis direction has non-flatness gaps Ge1 and Ge2.

Note that the present embodiment is based on an exemplary configuration where the organic light-emitting layers 115 and the cathode 116 are in contact with each other. However, electron injection layers, electron transport layer, and/or the like may be disposed between the organic light-emitting layers 115 and the cathode 116.

(2) Configuration of CF Panel Unit 12

Figure 5:
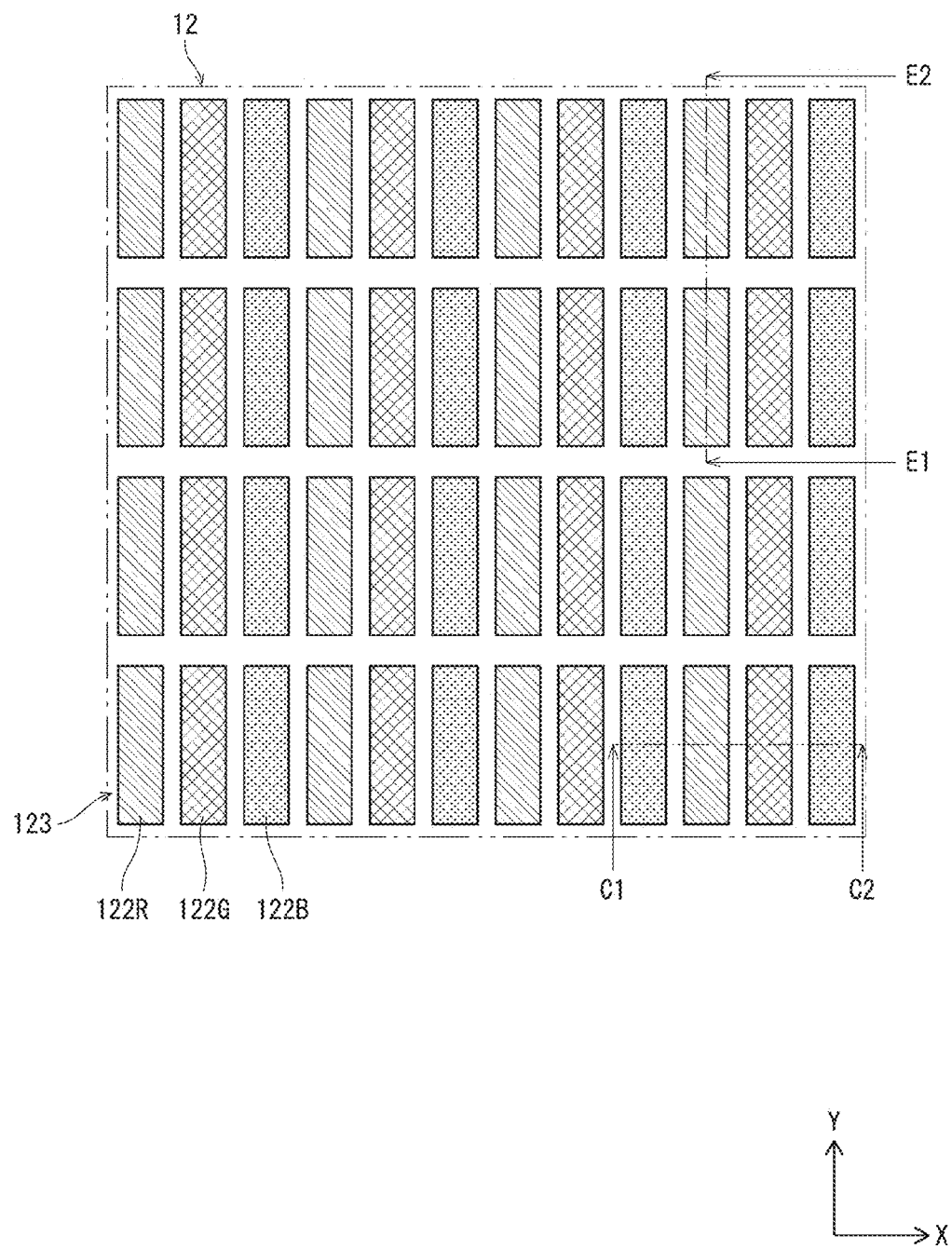
FIG. 5 is a schematic plan view illustrating a configuration of a CF panel unit 12 of the display panel 10.

As illustrated in FIG. 5, in plan view along a virtual plane including the X-axis and Y-axis, the CF panel unit 12 includes red color filter layers (R-CF layers) 122R, green color filter layers (G-CF layers) 122G, and blue color filter layers (B-CF layers) 122B. The color filter layers are arranged in a two-dimensional arrangement along the X-axis and Y-axis directions. The color filter layers 122R, 122G, 122B are arranged at positions corresponding to the sub-pixels 100R, 100G, 100B, respectively (see FIG. 2). In addition, the color filter layers 122R, 122G, 122B have shapes corresponding to the sub-pixels 100R, 100G, 100B. That is, the color filter layers 122R, 122G, 122B are rectangular and are longer in the Y-axis direction than in the X-axis direction.

As illustrated in FIGS. 6A and 6B, each pair of adjacent color filter layers 122 (also referred to in the following as CF layers 122) has disposed therebetween a black matrix layer 123 (also referred to in the following as a BM layer 123). Each CF layer 122 has peripheral portions that are located on BM layers 123.

The BM layers 123 are black layers disposed in order to prevent inward reflection of emitted light at the display surface of the display panel 10, to prevent penetration of light from the outside into the display panel 10, and to improve display contrast of the display panel 10. As illustrated in FIG. 3, the BM layer 123 are disposed at positions corresponding to the banks 114 of the EL panel unit 11, or that is, the BM layers 123 face the banks 114.

As illustrated in FIGS. 6A and 6B, in the CF panel unit 12, the height (thickness) t1 of upper surfaces 122a of the CF layers 122 from the surface of the substrate 121 is greater than the height (thickness) of upper surfaces 123a of the BM layers 123 from the surface of the substrate 121. In other words, the upper surfaces 122a of the CF layers 122 are positioned higher in the Z-axis direction than the upper surfaces 123a of the BM layers 123 by height t2.

3. Materials of Components of Display Panel 10

(1) Substrates 111 and 121

Each of the substrate 111 and the substrate 121 may be formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate.

When using a plastic substrate, the plastic substrate may be formed by using a thermoplastic resin or a thermosetting resin. For example, usable resins include polyolefin (e.g., polyethylene, polypropylene, ethylene-propylene copolymer, ethylene-vinyl acetate copolymer (EVA)), cyclic polyolefin, denatured polyolefin, polyvinyl chloride, polyvinylidene chloride, polystyrene, polyamide, polyimide (PI), polyamide-imide, polycarbonate, poly-(4-methylpentene-1), ionomer, acrylic resin, polymethyl methacrylate, acrylic-styrene copolymer (AS resin), butadiene-styrene copolymer, ethylene-vinyl alcohol copolymer (EVOH), polyester (e.g., polyethylene terephthalate (PET), polybutylene terephthalate, polyethylene naphthalate (PEN), polycyclohexane terephthalate (PCT)), polyether, polyether ketone, polyether sulfone (PES), polyether imide, polyacetal, polyphenylene oxide, denatured polyphenylene oxide, polyarylate, aromatic polyester (e.g., liquid crystal polymer), fluoro resin (e.g., polytetrafluoroethylene, polyfluorovinylidene), thermoplastic elastomer (e.g., styrene-based elastomer, polyolefin-based elastomer, polyvinylchloride-based elastomer, polyurethane-based elastomer, fluororubber-based elastomer, chlorinated polyethylene-based elastomer), epoxy resin, phenolic resin, urea resin, melamine resin, unsaturated polyester, silicone resin, or polyurethane, or a copolymer, a blended body or a polymer alloy each having at least one of these materials as a major component thereof, and the plastic substrate may be a laminate of one or more layers of any of these materials.

In the present embodiment, the substrate 111 of the EL panel unit 11 includes a conventional TFT layer. The TFT layer is not illustrated in any of the accompanying drawings and is not described in the present disclosure due to the TFT layer being implementable by using a conventional configuration thereof, as necessary.

(2) Interlayer Electrical Insulation Film 112

The interlayer electrical insulation film 112 is, for example, formed by using an organic compound such as polyimde, polyamide, or an acrylic resin. Here, the interlayer electrical insulation layer 112 is preferably resistant to organic solvents. Further, in the manufacturing process, processing such as etching and baking may be performed with respect to the interlayer electrical insulation layer 112. Taking this into account, the interlayer electrical insulation layer 112 is preferably formed by using a material having high resistance with respect to such processing and thus does not undergo excessive deformation, deterioration, and the like in such processing.

(3) Anodes 113

The anodes 113 are formed by using a metal material containing silver (Ag) or aluminum (Al). In the display panel 10, which is a top-emission-type panel, the anodes 113 preferably have high optical reflectivity at surface portions thereof.

The anodes 113 need not be composed of a single layer formed by using the above-described metal material. For example, the anodes 113 each may be a laminate of a metal layer and a light-transmissive, electrically-conductive layer. In this case, the light-transmissive, electrically-conductive layer may be formed by using, for example, indium tin oxide (ITO) or indium zinc oxide (IZO).

(4) Banks 114

The banks 114 are formed by using an organic material such as a resin, and have an electrically-insulative property. Examples of organic materials usable for forming the banks 114 include an acrylic resin, a polyimide resin, and a novolac type phenolic resin. Further, surfaces of the banks 114 may be treated with fluorine, in which case the surfaces of the banks 114 are provided with water repellency.

Further, the banks 114 need not be composed of a single layer as illustrated in FIG. 3 and FIGS. 4A and 4B, and instead may be composed of two or more layers. When configuring the banks 114 to have such a multi-layer structure, the layers may each contain a combination of the materials described above, or the layers may include one or more layers containing inorganic material and one or more layers containing organic material.

(5) Organic Light-Emitting Layers 115

The organic light-emitting layers 115 are put in excitation state when holes and electrons are injected and recombine therein, and emit light in this excitation state. The organic light-emitting layers 115 are beneficially formed by using an organic material which has a light-emitting property and a film of which can be formed through wet printing.

For example, the organic light-emitting layers 115 are preferably formed by using one of the fluorescent materials disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound; an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic aldadiene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex.

(6) Cathode 116

The cathode 116 is, for example, formed by using ITO or IZO. In the display panel 10, which is a top-emission-type panel, the cathode 116 beneficially is formed by using a material having optical transmissivity. Further, the material used for forming the cathode 116 preferably has an optical transmittance of 80% or higher.

(7) Sealing Layer 117

The sealing layer 117 prevents organic layers such as the organic light-emitting layers 115 from being exposed to moisture, ambient air, etc. For example, the sealing layer 117 is formed by using a material such as SiN (silicon nitride), SiON (silicon oxynitride), or $Al_2O_3$ (alumina). Further, the sealing layer 117 may include, in addition to a layer formed by using SiN, SiON, or $Al_2O_3$, a sealing resin layer formed by using a resin material such as acrylic resin or silicone resin.

In the display panel 10, which is top-emission-type panel, the sealing layer 117 beneficially is formed by using a material having optical transmissivity.

(8) Color Filter Layers 122

In the CF panel unit 12, the color filter layers 122 of each of the colors red (R), green (G), and blue (B) are formed by using a conventional material selectively allowing visible light of a wavelength region of the corresponding color to pass through. For example, the color filter layers 122 may be formed by using acrylic resin as a base material.

(9) BM Layers 123

In the CF panel unit 12, the BM layers 123 are, for example, formed by using an ultraviolet curing resin material containing black pigment that absorbs light excellently and achieves an excellent light blocking effect. One specific example of such ultraviolet curing resin material is acrylic resin.

(10) Sealing Resin Layer 13

The sealing resin layer 13 may be formed by using various light-transmissive resin materials. For example, the sealing resin layer 13 may be formed by using epoxy resin or silicone resin.

(11) Additional Components

When disposing hole injection layers and/or hole transport layers, which are not described in the embodiment, between the anodes 113 and the organic light-emitting layers 115, each of such layers may be formed, for example, by using the materials described in the following.

(i) Hole Injection Layers

For example, the hole injection layers are formed by using an oxide of a material such as silver (Ag), molybdenum (Mo), chromium (Cr), vanadium (V), tungsten (W), nickel (Ni), or iridium (Ir), or an electrically-conductive polymer material such as polyethylenedioxythiophene (PEDOT; mixture of polythiophene and polystyrene sulfonic acid). The hole injection layers, when formed by using a metal oxide among the materials described above, has a greater work function compared to the hole injection layers, when formed by using an electrically-conductive polymer material such as PEDOT, and has functions of assisting the generation of holes and stably injecting holes to the organic light-emitting layers 115.

Further, the hole injection layers, when formed by using an oxide of a transition metal, have multiple energy levels due to oxides of transition metals having multiple oxidation states. This results in the hole injection layers readily performing hole injection and thus achieving a reduction in driving voltage. In particular, forming the hole injection layers by using tungsten oxide ($WO_x$) is beneficial, in order to provide the hole injection layers with the functions of stable hole injection and hole generation assistance.

(ii) Hole Transport Layers

The hole transport layers are made by using a high molecular compound without any hydrophilic groups. For example, the hole transport layers may be formed by using a high molecular compound, such as polyfluorene or a derivative thereof or polyarylamine or a derivative thereof, without any hydrophilic groups.

Further, when disposing an electron transport layer between the organic light-emitting layers 115 and the cathode 116, the electron transport layer may be formed, for example, by using the materials described in the following.

(iii) Electron Transport Layer

The electron transport layer has the function of transporting electrons injected from the cathode 116 to the organic light-emitting layers 115. The electron transport layer is formed, for example, by using an oxidiazole derivative (OXD), a triazole derivative (TAZ), or a phenanthroline derivative (BCP, Bphen).

4. Arrangement of EL Panel Unit 11 and CF Panel Unit 12

Figure 7:
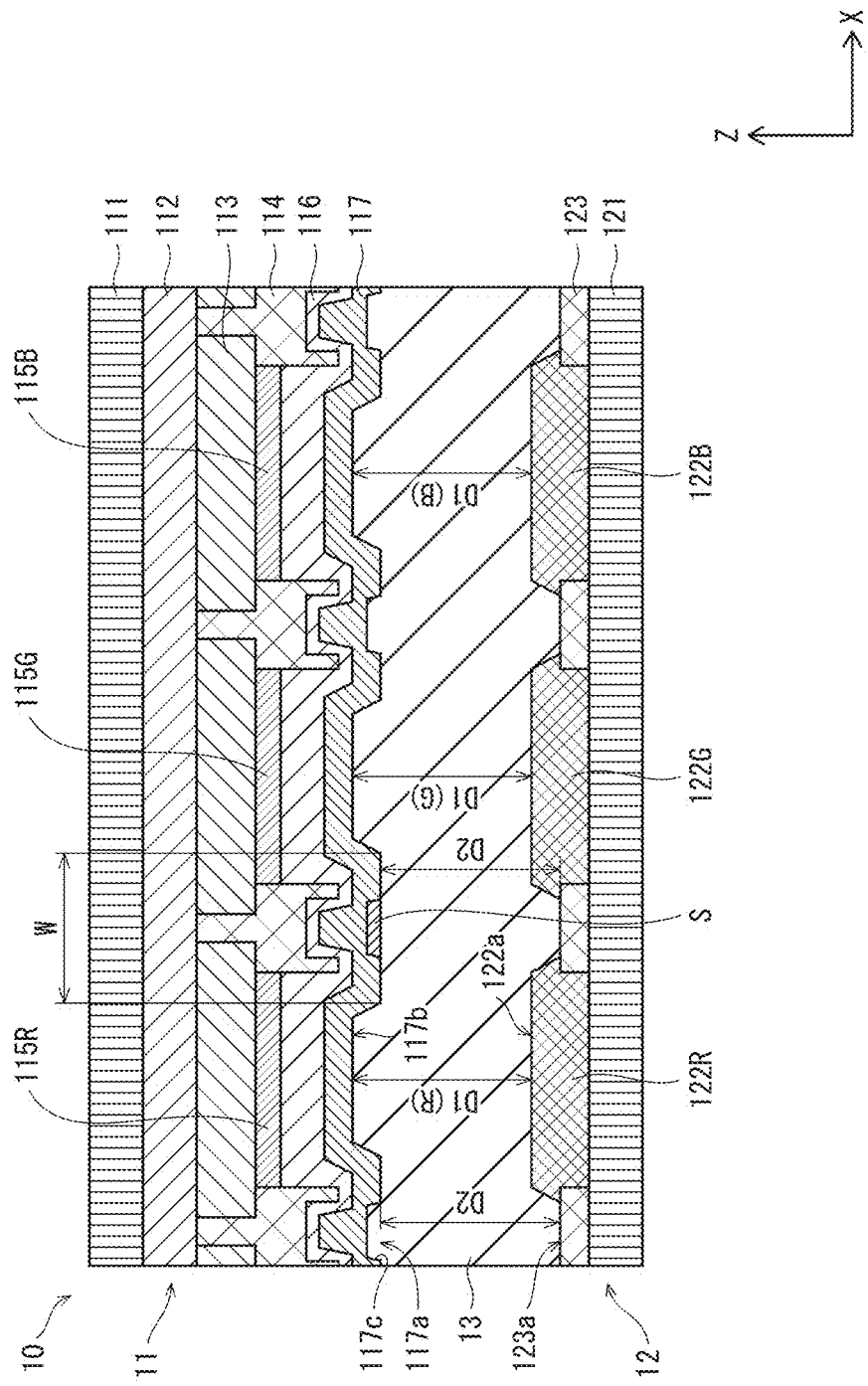
FIG. 7 is a schematic cross-sectional view illustrating arrangement of the EL panel unit 11 and the CF panel unit 12 in the display panel 10.
Figure 8:
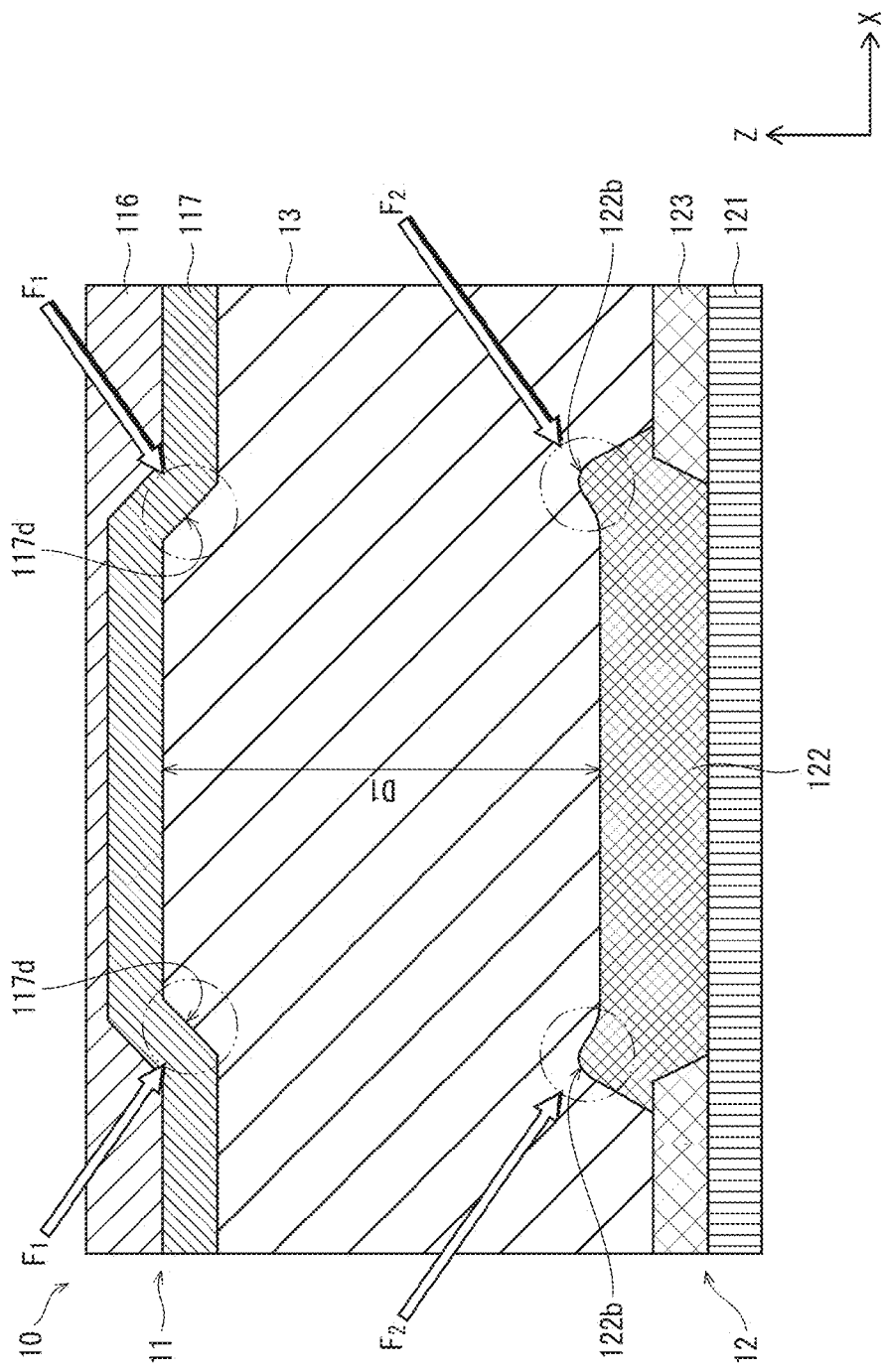
FIG. 8 is a schematic cross-sectional view illustrating the arrangement of the EL panel unit 11 and the CF panel unit 12 in detail.

The following describes how the EL panel unit 11 and the CF panel unit 12 are arranged with respect to one another in the display panel 10, with reference to FIGS. 7 and 8.

As illustrated in FIG. 7, in the display panel 10 pertaining to the present embodiment, the main surface (main surface that is further downward in the Z-axis direction) of the EL panel unit 11 that faces the CF panel unit 12 is a non-flat surface. That is, the surface of the sealing layer 117, which is the main surface of the EL panel unit 11 that faces the CF panel unit 12, is a non-flat surface as a whole, due to including the protrusion portions 117a, the first recess portions 117b, and the second recess portions 117c. This has been already described earlier in the present disclosure.

Meanwhile, in the display panel 10 pertaining to the present embodiment, the main surface (main surface further upward in the Z-axis direction) of the CF panel 12 that faces the EL panel unit 11 also is a non-flat surface. That is, the upper surfaces 122a of the R-CF layers 122R, the G-CF layers 122G, and the B-CF layers 122B protrude further upward in the Z-axis direction (toward the EL panel unit 11) than the upper surfaces 123a of the BM layers 123.

In the CF panel unit 12, each of the CF layers 122 (the R-CF layers 122R, the G-CF layers 122G, and the B-CF layers 122B) is arranged at a position corresponding to one first recess portion 117b in the EL panel unit 11. Further, each of the BM layers 123 is arranged at a position corresponding to a top of one bank 114 in the EL panel unit 11. Meanwhile, in the present embodiment, the peripheral portions of each of the CF layers 122 are located on BM layers 123.

In the following, as illustrated in FIG. 7, a distance between a first recess portion 117b of the sealing layer 117 in the EL panel unit 11 and an upper surface 122a of a R-CF layer 122R in the CF panel unit 12 is denoted as "D1(R)", a distance between a first recess portion 117b and an upper surface 122a of a G-CF layer 122G is denotes as "D1(G)", and a distance between a first recess portion 117b and an upper surface 122a of a B-CF layer 122B is denoted as "D1(B)". Further, a distance between a top of a protrusion portion 117a of the sealing layer 117 in the EL panel unit 11 and an upper surface 123a of a BM layer 123 in the CF panel unit 12 is denoted as "D2". In addition, an X-axis direction width of a top of a protrusion portion 117a of the sealing layer 117 in the EL panel unit 11 is denoted as "W". Note that in the present disclosure, the X-axis direction is the one direction in which the light-emitting area and the non-light-emitting area are disposed next to one another. Further, an area of a cross-section of a second recess portion 117c taken along a virtual plane including the X-axis and the Z-axis is denoted as "S". In other words, S denotes an area of a cross-section of the second recess portion taken along a plane defined by the X-axis direction and a direction perpendicular to a surface of the sealing layer 117 of the EL panel unit 11, which in the present disclosure is the first main surface. Using such notations, the following relations are satisfied in the display panel 10 pertaining to the present embodiment.

$$D2<0.90\times D1(R) \text{ and}$$
$$S>\{(0.90\times D1(R))-D2\}\times W \quad \text{(Mathematical Formula 1)}$$

$$D2<0.90\times D1(G) \text{ and}$$
$$S>\{(0.90\times D1(G))-D2\}\times W \quad \text{(Mathematical Formula 2)}$$

$$D2<0.90\times D1(B) \text{ and}$$
$$S>\{(0.90\times D1(B))-D2\}\times W \quad \text{(Mathematical Formula 3)}$$

Note that a modification may be made such that the sealing layer 117 in the EL panel unit 11 and the CF layers 122 in the CF panel unit 12 have the respective shapes illustrated in FIG. 8. When making this modification, the distances D1 are defined as follows.

First, slope portions 117*d* (indicated by arrows $F_1$) on the surface of the sealing layer 117 are excluded from consideration.

Further, projecting portions 122*b* (indicated by arrows F2) on the surfaces of the CF layers 122 are also excluded from consideration. Each projecting portion 122*b* is located on a BM layer 123 and bulges upward in the Z-axis direction.

Thus, when making this modification, the distances D1 are distances between portions of the surface of the sealing layer 117 other than the slope portions 117*d* and portions of the surfaces of the CF layers 122 other than the projecting portions 122*b*. In other words, the distances D1 are defined at approximate centers of the first recess portions on the main surface of the EL panel unit 11 that faces the CF panel unit 12.

5. Effect

Due to (Mathematical Formula 1) through (Mathematical Formula 3) being satisfied in the display panel 10 pertaining to the present embodiment, the risk is low of film detachment occurring in the process of forming the sealing resin layer 13. This is because the risk is low of resin flow causing the film detachment occurring when heat or light energy is applied with respect to resin material. Thus, the display panel 10 pertaining to the present embodiment has high display quality.

The risk of resin flow and consequent film detachment occurring is considered to be low due to the following mechanism.

In the display panel 10 pertaining to the present embodiment, the EL panel unit 11 and the CF panel unit 12 are configured to satisfy (Mathematical Formula 1) through (Mathematical Formula 3). Thus, the volume of the sealing resin layer 13 at light-emitting areas and the volume of the sealing resin layer 13 at non-light-emitting areas are similar. The light-emitting areas are areas composing the sub-pixels 100R, 100G, 100B, and the non-light-emitting areas are areas between adjacent sub-pixels 100R, 100G, 100B. Due to this, the risk is low of resin flow occurring when the resin between the EL panel unit 11 and the CF panel unit 12 is provided with flowability.

Meanwhile, when the distances between portions of the EL panel unit 11 and portions of the CF panel unit 12 do not satisfy (Mathematical Formula 1) through (Mathematical Formula 3), it is considered that, excluding the exceptional situation described later in the present disclosure, the density of the sealing resin layer 13 at the non-light-emitting areas becomes higher than that at the light-emitting areas, which leads to resin flow occurring from high density areas to low density areas when energy in the form of heat or light is applied for curing the sealing resin. This is considered to be the reason why film detachment occurs in conventional technology.

6. Manufacturing Method

The following describes a manufacturing method of the display panel 10 pertaining to the present embodiment, with reference to FIGS. 9A through 9E, FIGS. 10A through 10D, FIGS. 11A through 11F, FIGS. 12A through 12C, and FIGS. 13A through 13C. Note that in the following, the production of the display panel 10 pertaining to the present embodiment will be described by roughly dividing the process into (1) a process of preparing the EL panel unit 11, (2) a process of preparing the CF panel unit 12, and (3) a process of adhering the EL panel unit 11 and the CF panel unit 12 together.

(1) Process of Preparing EL Panel Unit 11

(i) As illustrated in FIG. 9A, the interlayer electrical insulation film 112 is formed on the substrate 111, which includes the TFT layer. Then, as illustrated in FIG. 9B, a metal thin film 1130 is formed on the interlayer electrical insulation film 112. The metal thin film 1130 can be formed, for example, through sputtering.

Next, the metal thin film 1130 on the interlayer electrical insulation film 112 is patterned, and the anodes 113 and an auxiliary electrode (bus bar) 118 are formed, as illustrated in FIG. 9C. Patterning can be performed, for example, through photolithography.

Figure 10A:
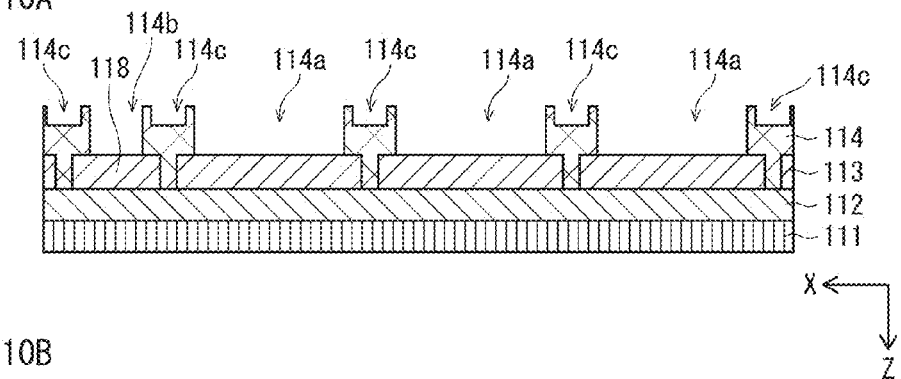
FIGS. 10A to 10D are schematic views illustrating production processes of the EL panel unit 11.

Next, as illustrated in FIG. 9D, a bank material layer 1140 made of an electrically insulative organic material is formed so as to cover the anodes 113 and the auxiliary electrode 118. Then, as illustrated in FIG. 9E, a photomask 1141 having opening windows 1141*a* and halftone windows 1141*b* is arranged above the bank material layer 1140. In this process, the photomask 1141 is placed above the bank material layer 1140 such that the opening windows 1141*a* are arranged at portions where later-described openings 114*a* and 114*b* (FIG. 10A) are to be formed, and the halftone windows 1141*b* are arranged at portions where the dents 114*c* are to be formed. By performing exposure and developing (wet process) in this state, the openings 114*a* and 114*b* are formed to penetrate through the bank material layer 1140 from the upper surface to the lower surface, and the dents 114*c* are formed to have a predetermined depth from the upper surface of the bank material layer 1140, as illustrated in FIG. 10A. Thus, the banks 114 are formed in erected state between adjacent ones of the anodes 113, and between the auxiliary electrode 118 and the anode 113 adjacent thereto.

Figure 10B:
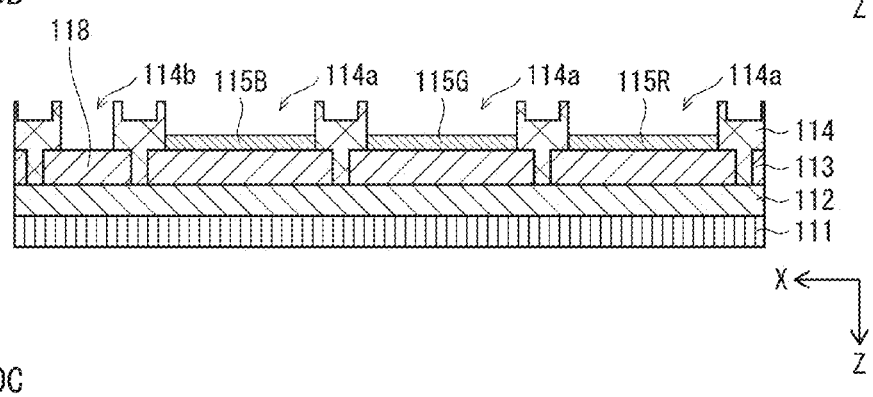

(ii) As illustrated in FIG. 10B, the organic light-emitting layers 115 are formed in the openings 114*a* defined by the banks 114. The organic light-emitting layers 115 formed in the openings 114*a* are classified into organic light-emitting layers 115R, 115G, and 115B, each emitting light of a different color. In this process, no organic light-emitting layer is formed in the opening 114*b*, which is located above the auxiliary electrode 118.

The organic light-emitting layers 115R, 115G, 115B are formed, for example, by using an inkjet method. Specifically, the organic light-emitting layers 115R, 115G, 115B are formed by applying ink containing organic light-emitting material onto each of the openings 114*a*, and then drying the ink.

Figure 10C:
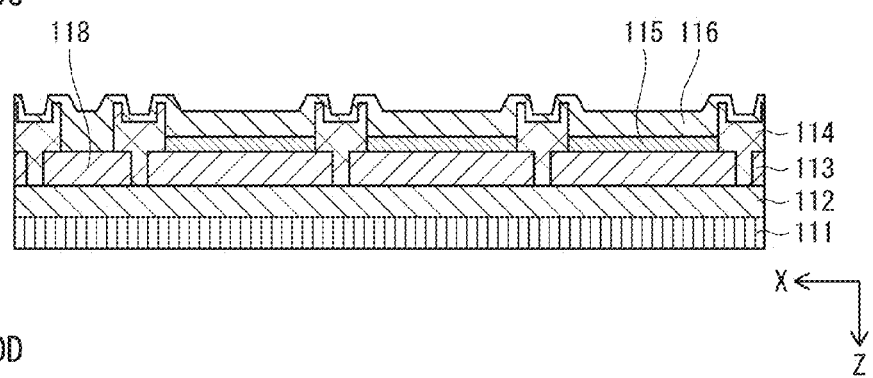

(iii) As illustrated in FIG. 10C, the cathode 116 is formed so as to continuously cover the organic light-emitting layers 115 and exposed portions of the banks 114. The cathode 116 can be formed, for example, through sputtering.

Figure 10D:
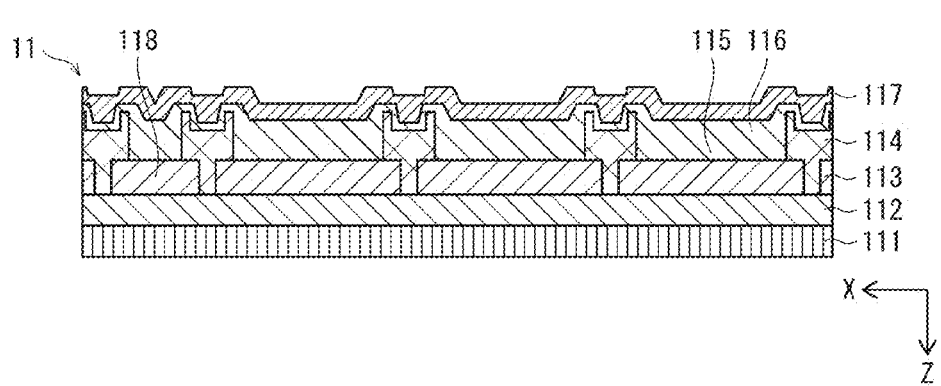

(iv) As illustrated in FIG. 10D, the sealing layer 117 is formed to cover the cathode 116. The sealing layer 117 can be formed, for example, through sputtering, chemical vapor deposition (CVD), or atomic layer deposition (ALD).

(2) Process of Preparing CF Panel Unit 12

Figure 11A:
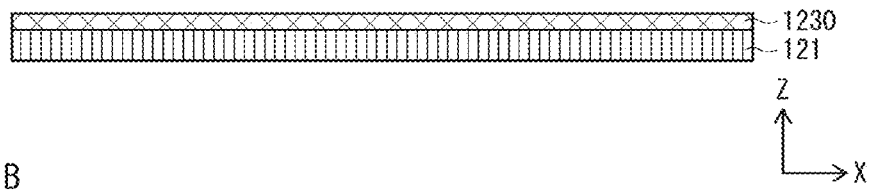
FIGS. 11A to 11F are schematic views illustrating production processes of the CF panel unit 12.

(i) As illustrated in FIG. 11A, a BM material layer 1230 is formed on one main surface of the substrate 121. In the forming of the BM material layer 1230, first, a BM paste is prepared by dispersing in a solvent a BM material containing an ultraviolet curing resin (for example, an ultraviolet curing acrylic resin) material as the main component and a black pigment as an additive. Then, the paste so prepared is applied to cover the main surface of the substrate 121.

Next, the BM material layer 1230 is formed by drying the applied paste to volatilize the solvent to a certain degree.

Figure 11B:
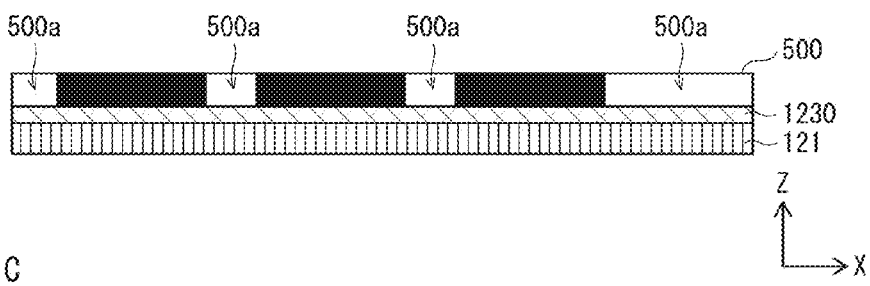
Figure 11C:
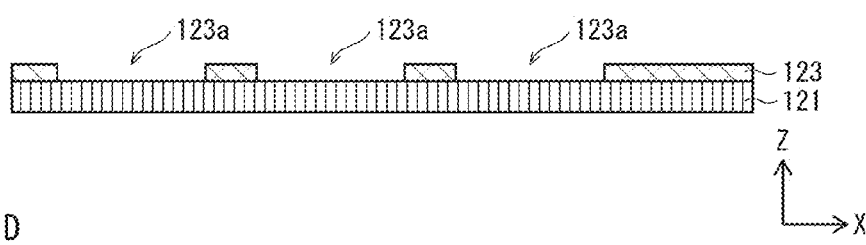

(ii) As illustrated in FIG. 11B, a mask 500 is arranged on the BM material layer 1230, which has been dried enough to maintain its shape. The mask 500 has windows 500a formed therein at locations corresponding to positions of the banks 114 in the EL panel unit 11.

Next, exposed surfaces of the BM material layer 1230 are irradiated with ultraviolet rays, through the windows 500a of the mask 500.

(iii) After irradiation with ultraviolet rays, the BM material layer 1230 is first dried and then developed. The developing removes the portions of the BM material layer 1230 that have not been exposed to the ultraviolet rays. Then, baking is performed to form the BM layers 123 illustrated in FIG. 11C. Note that the BM layers 123 are formed at positions corresponding to the banks 114 in the EL panel unit 11.

Figure 11D:
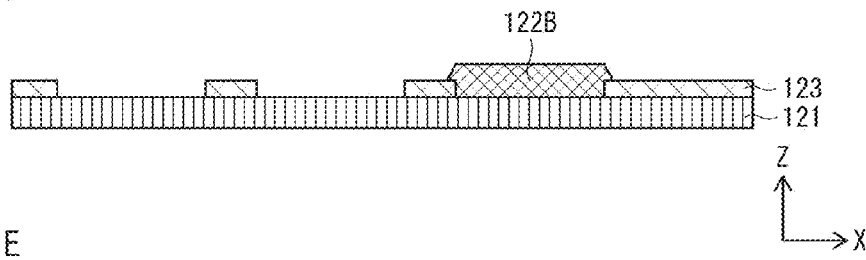

(iv) As illustrated in FIG. 11D, the blue CF layers 122B are formed in corresponding one of the openings 123a defined by the BM layers 123. The forming of the CF layers 122B is performed as follows. First, a paste is prepared by dispersing in a solvent a CF material containing an ultraviolet curing resin component as the main component. Next, the paste is applied, and the solvent is caused to volatize to a certain degree. Then, an undepicted mask having windows formed at predetermined positions thereof is arranged, and the paste is irradiated with ultraviolet rays through the windows.

Then, processing including developing, removal of the mask, and the removal of any uncured paste, is performed before baking. Thus, the B-CF layers 122B are formed as illustrated in FIG. 11D. Note that as already described above, the peripheral portions of each of the CF layers 122 are located on BM layers 123.

Figure 11E:
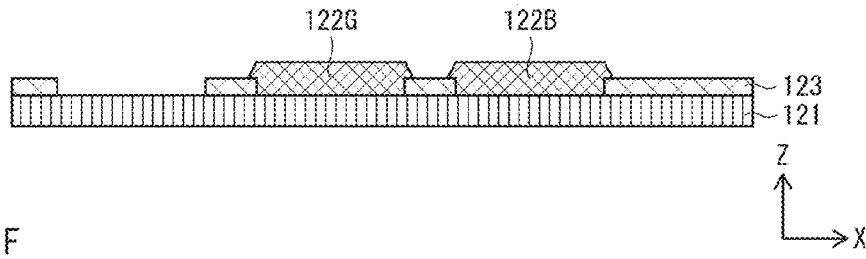

(v) As illustrated in FIG. 11E, processing similar to that described above is repeated to form the G-CF layers 122G.

Figure 11F:
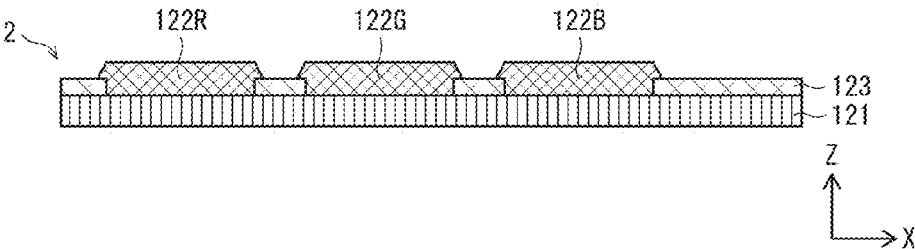

(vi) As illustrated in FIG. 11F, processing similar to that described above is repeated to form the R-CF layers 122R.

Note that the R-CF layers 122R, the G-CF layers 122G, and the B-CF layers 122B need not be formed in the order described above.

Figure 12A:
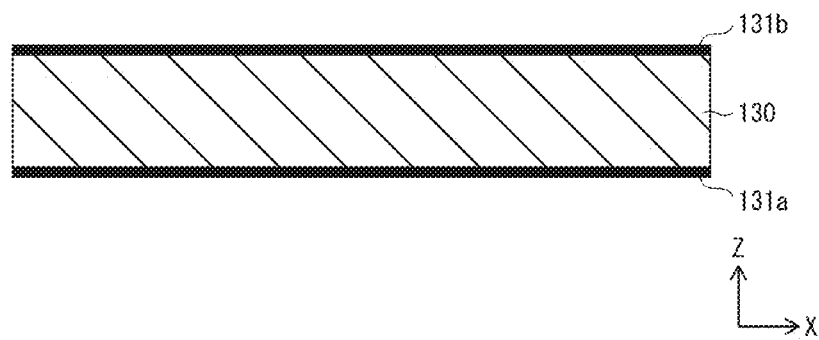
FIGS. 12A to 12C are schematic views illustrating an adhesion process of the EL panel unit 11 and the CF panel unit 12.

(3) Process of Adhering EL Panel Unit 11 and CF Panel Unit 12 Together (i) As illustrated in FIG. 12A, a non-flowable resin (material) 130 is prepared. The non-flowable resin 130 has laminate films 131a and 131b adhered thereto, each at a different one of the two main surfaces thereof.

Figure 12B:
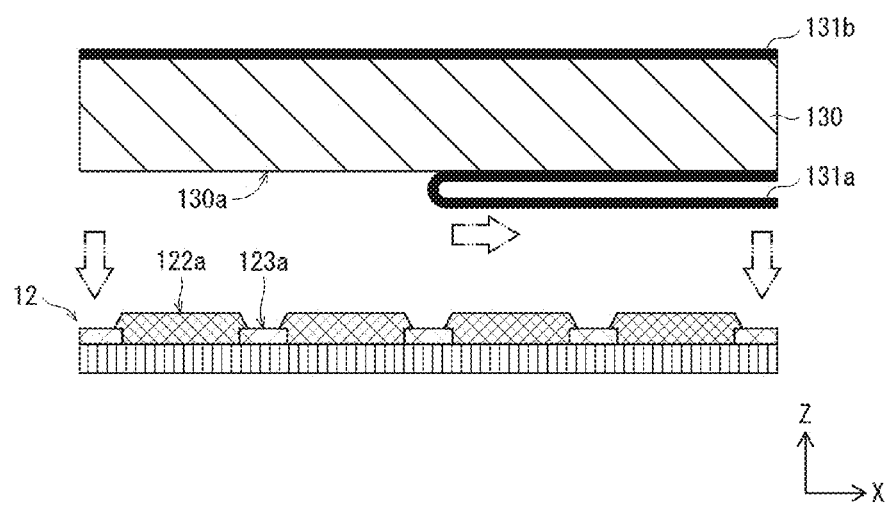

(ii) As illustrated in FIG. 12B, the laminate film 131a is peeled off, and a main surface 130a of the non-flowable resin 130 that is consequently exposed is adhered to the CF panel unit 12. Note that in the present embodiment, the non-flowable resin 130 and the CF panel unit 12 are adhered together under a reduced-pressure atmosphere.

Figure 12C:
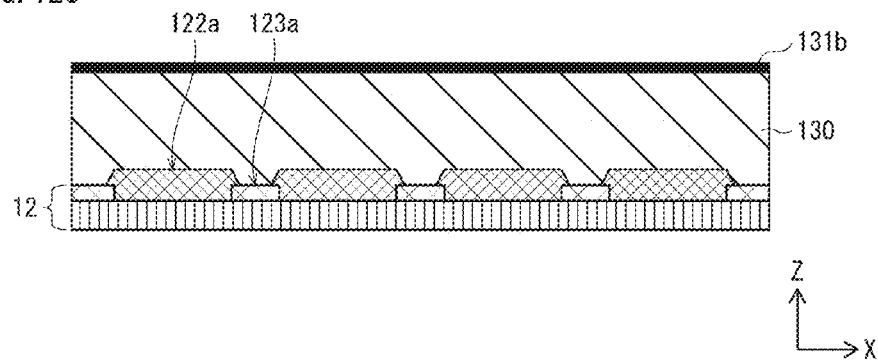

(iii) Upon completion of the adhesion to the CF panel unit 12, the main surface 130a of the non-flowable resin 130 is in close contact with an entirety of a main surface of the CF panel unit 12 that includes the upper surfaces 123a of the BM layers 123 and the upper surfaces 122a of the CF layers 122, as illustrated in FIG. 12C.

Figure 13A:
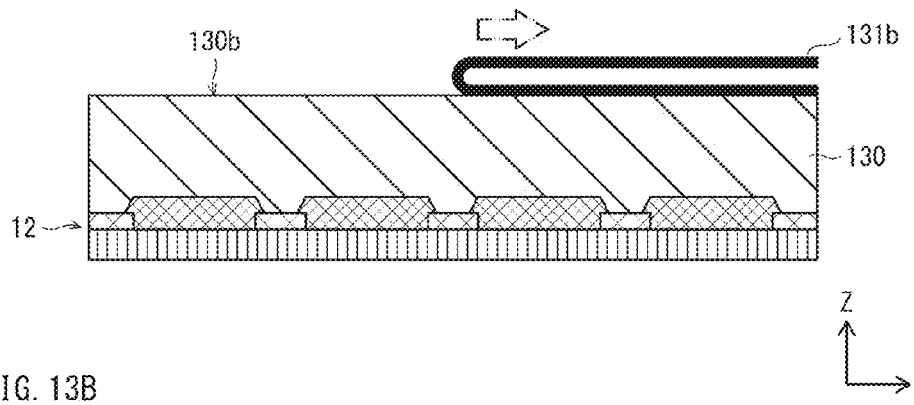
FIGS. 13A to 13C are schematic views illustrating the adhesion process of the EL panel unit 11 and the CF panel unit 12.

(iv) As illustrated in FIG. 13A, the laminate film 131b is peeled off to expose a main surface 130b of the non-flowable resin 130.

Figure 13B:
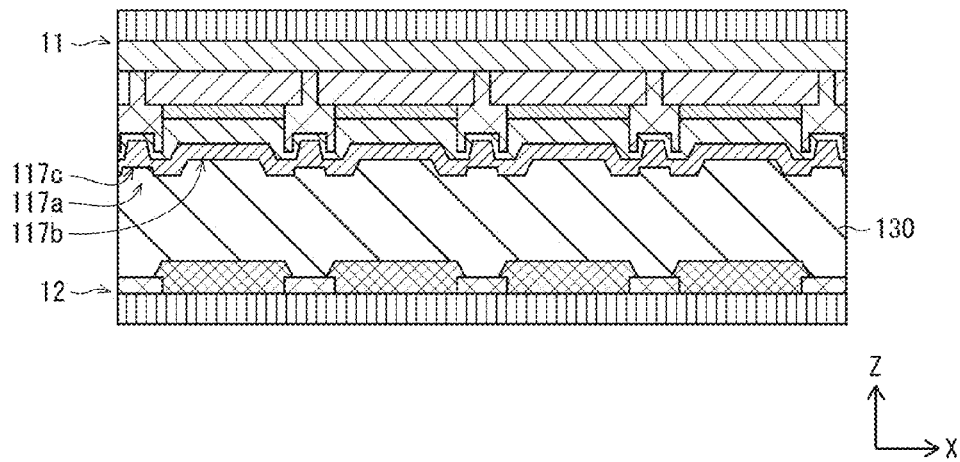

(v) As illustrated in FIG. 13B, the EL panel unit 11 is adhered to the main surface 130b, which is now exposed due to the laminate film 131b having been peeled off. This process is also performed under a reduced-pressure atmosphere. Therefore, upon completion of the adhesion to the EL panel unit 11, the main surface 130b of the non-flowable resin 130 is in close contact with an entirety of a main surface of the EL panel unit 11 that includes the bottoms of the first recess portions 117b, the tops of the protrusion portions 117a, and the bottoms of the second recess portions 117c, as illustrated in FIG. 13B.

Figure 13C:
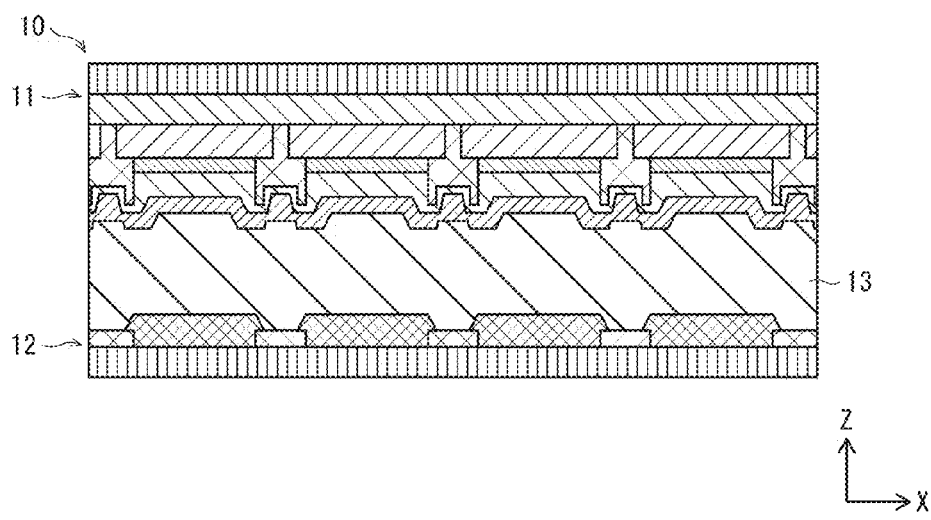

(vi) As illustrated in FIG. 13C, after adhering the EL panel unit 11 and the CF panel unit 12 together with the non-flowable resin 130 therebetween in a vacuum state, the non-flowable resin 130 is irradiated with light (for example, ultraviolet light) to provide the non-flowable resin 130 with flowability, and then curing is performed. Thus the sealing resin layer 13 is formed. This completes the production of the display panel 10. Note that depending on the resin that is used, the resin may be cured by heating.

In the present embodiment, the non-flat main surfaces of the EL panel unit 11 and the CF panel unit 12 that face one another are defined so that (Mathematical Formula 1) through (Mathematical Formula 3) are satisfied. This reduces the variance in density distribution after the adhesion process described in (iii) above has been performed, and thus reduces the risk of film detachment occurring as a result of the process of providing the resin with flowability described in (iv) above.

[First Observation of Non-Flatness Level]

The following describes a first observation of non-flatness level, with reference to FIGS. 14A and 14B and FIGS. 15A and 15B.

1. Non-Flat Surface of EL Panel Unit 11A

Figures 14A, 14B:
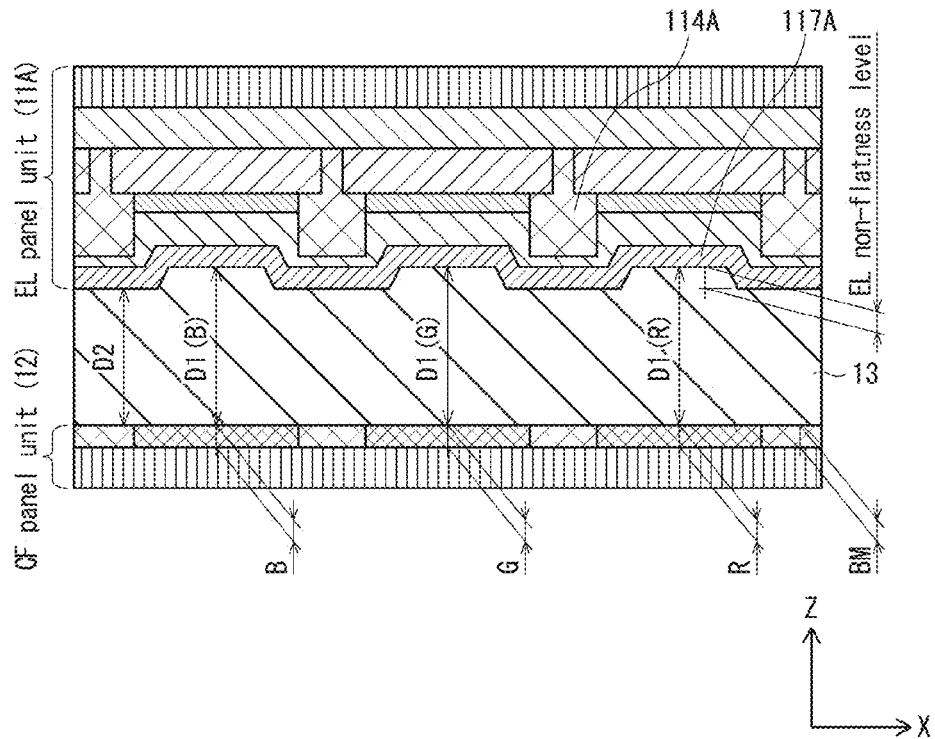
FIG. 14A is a schematic cross-sectional view illustrating the arrangement of the EL panel unit 11 and the CF panel unit 12 in the display panel 10.
FIG. 14B is a table illustrating dimensions of samples No. 1 through No. 4 used for observation.

As illustrated in FIG. 14A, a main surface (sealing layer surface) of an EL panel unit 11A pertaining to the present observation that faces the CF panel unit 12 was a non-flat surface. When considering the level of the bottoms of the recess portions as the reference level of the main surface of the EL panel unit 11A, the non-flat main surface can be considered as having only protrusions. On the other hand, when considering the level of the tops of the protrusion portions as the reference level, the non-flat main surface can be considered as having only recesses. In the present disclosure, a non-flat surface is defined as a surface that can be considered as having recesses or protrusions, depending upon where the reference level is set. Note that as illustrated in FIG. 14A, the EL panel unit 11A that was used in the present observation differed from the EL panel unit 11 pertaining to the embodiment for having banks 114A without any dent portions. Due to this, the sealing layer 117A in the EL panel unit 11A did not have second recess portions.

When setting the level of the main surface above the R, G, B sub-pixels as a reference level, the main surface has protrusions at positions between adjacent sub-pixels, or in other words, at positions above banks. Seen in another way, when setting the level of the main surface most distant from the substrate (i.e., the level above the tops of the banks) as a reference level, the main surface has recesses with bottoms between adjacent banks.

In the following, the expression "EL non-flatness level" is used to refer to the height of protrusions (or the depth of recesses) on the main surface of the EL panel unit 11A. Further, in the observation, multiple samples as illustrated in FIG. 14B were used. As illustrated in FIG. 14B, the EL non-flatness level was: 1.8 μm in Sample No. 1, 2.0 μm in Sample No. 2, 2.1 μm in Sample No. 3, and 2.2 μm in Sample No. 4.

2. Non-Flatness of CF Panel Unit 12

As illustrated in FIG. 14A, the CF panel unit 12 pertaining to the embodiment was used in the present observation, with the thicknesses of the CF layers of all colors R, G, and B set to the same thickness of 1.0 μm. In FIG. 14A, the reference signs R, G, and B respectively indicate the thicknesses of the R-CF layers, the G-CF layers, and the B-CF layers.)

Further, the thickness of the BM layers was set to 1.0 μm over the entire surface. In FIG. 14A, reference sign BM indicates the thickness of the BM layers.

Accordingly, the main surface of the CF panel unit 12 did not have recesses or protrusions (i.e., flat). Specifically, when setting the level of the upper surfaces of the BM layers as the reference level, the upper surfaces of the CF layers of all colors R, G, and B were flush with the reference level.

3. Distance between Panel Units

As illustrated in FIGS. 14A and 14B, distances D1(R), D1(G), and D1(B) between the CF panel unit 12 and the bottoms of the recess portions of the EL panel unit 11A were all set to 20.0 μm. Note that in the present observation, the height of the CF layers and the depth of the recess portions between banks were not changed among sub-pixels of the different colors R, G, and B.

Further, as illustrated in FIG. 14B, distance D2 between the CF panel unit 12 and the tops of the protrusion portions of the main surface of the EL panel unit 11A was: 18.2 μm in Sample No. 1, 18.0 μm in Sample No. 2, 17.9 μm in Sample No. 3, and 17.8 μm in Sample No. 4. Note that the distances D1 and D2 with respect to the EL panel unit 11A have the same definitions as the distances D1 and D2 with respect to the EL panel unit 11 described above, respectively.

Further, as illustrated in FIG. 14B, the ratio of D2 to D1 (D2/D1) was: 91.0% in Sample No. 1, 90.0% in Sample No. 2, 89.5% in Sample No. 3, and 89.0% in Sample No. 4.

4. Result of Check of Film Detachment

Figures 15A, 15B:
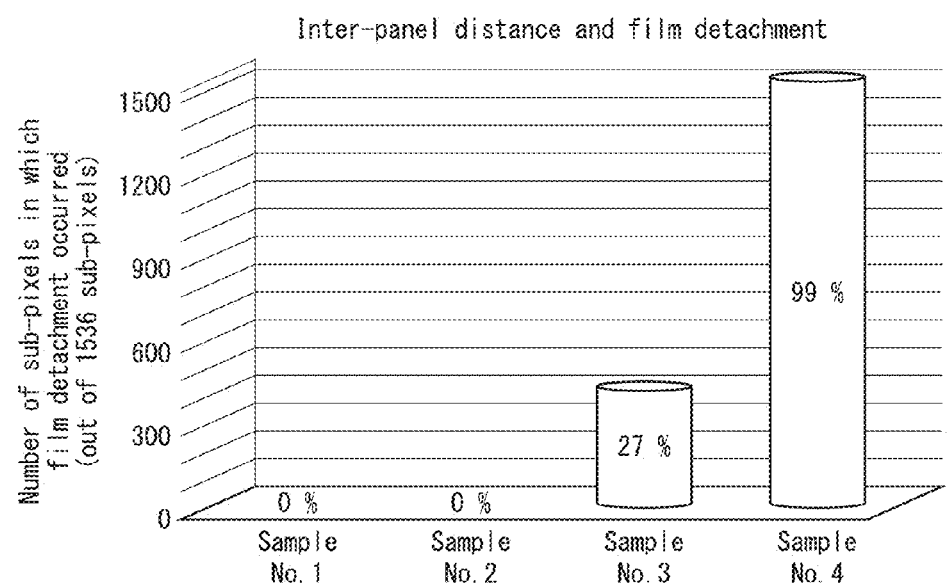
FIGS. 15A and 15B are respectively a table and a graph illustrating, for each of samples No. 1 through No. 4, a result of a check of whether film detachment occurred.

As illustrated in FIGS. 15A and 15B, film detachment did not occur in samples No. 1 and No. 2. Meanwhile, in sample No. 3, film detachment occurred in 419 of the 1536 sub-pixels, which amounts to 27% of all sub-pixels. Further, in sample No. 4, film detachment occurred in 1530 of the 1536 sub-pixels, which amounts to 99% of all sub-pixels.

As such, while film detachment occurred in sample No. 3, the number and the percentage of sub-pixels in which film detachment occurred were lower than those in sample No. 4. Thus, the greater the ratio D2/D1 was, the smaller the risk of film detachment was, and film detachment did not occur when the ratio D2/D1 was 90% or greater.

These results indicate that the greater the ratio D2/D1, the lower the risk of film detachment. In other words, the smaller the difference between distance D1 (distance between panel units in light-emission areas) and distance D2 (distance between panel units in non-light-emitting areas), the lower the risk of film detachment. In particular, the results indicate that film detachment does not occur when the ratio D2/D1 is 90% or greater.

5. Consideration regarding Resin Flow

As described above, the inventor of the present invention identified the mechanism through which detachment of a panel unit film (a vapor deposition film, an application film, and/or the like) occurs depending upon resin density distribution upon adhesion of panel units. According to this, the present inventor found that the risk of film detachment varies depending upon non-flatness level of panel unit main surface. Further, the present inventor confirmed the occurrence of the following phenomena, in connection with film detachment.

(1) Film detachment consistently occurs at positions along peripheral portions of the banks of the EL panel unit 11A.

(2) The greater the height of the banks of the EL panel unit 11A, the higher the risk of film detachment.

The present inventor conducted detailed observation by changing the height of the banks in the EL panel unit 11A, as illustrated in FIG. 14B. Through this observation, the present inventor found that the occurrence of film detachment is primarily dependent upon the non-flatness of the main surface of the EL panel unit 11A. That is, in the forming of the sealing resin layer 13, the resin density distribution when the EL panel unit 11A and the CF panel unit 12 have been adhered affects resin flow occurring when the resin is provided with flowability. The present inventor found that the resin density distribution is influenced by bank height (bank projection amount).

[Second Observation of Non-Flatness Level]

The following describes a second observation of non-flatness level, with reference to FIGS. 16A, 16B, and 16C.

As illustrated in FIGS. 16A and 16B, this observation was conducted by varying the thickness of the organic light-emitting layers among different sub-pixels in the EL panel unit 11A. Specifically, the organic light-emitting layers in R sub-pixels were provided with a thickness $T_{EML(R)}$ of 0.22 μm, the organic light-emitting layers in G sub-pixels were provided with a thickness $T_{EML(G)}$ of 0.20 μm, and the organic light-emitting layers in B sub-pixels were provided with a thickness $T_{EML(B)}$ of 0.15 μm.

Meanwhile, in the CF panel 12 used in this observation, the thickness of the BM layers and the thicknesses of the CF layers of all colors R, G, and B were all set to the same thickness of 1.0 μm, and the main surface of the CF panel unit 12 was flat.

As illustrated in FIGS. 16A and 16B, the distance D1(R) between the panel units at locations corresponding to the R sub-pixels in the EL panel unit 11A was 19.93 μm, the distance D1(G) between the panel units at locations corresponding to the G sub-pixels was 19.95 μm, and the distance D1(B) between the panel units at locations corresponding to the B sub-pixels was 20.0 μm. Further, the distance D2, which is the distance between the panel units at non-light-emitting areas, was 17.95 μm.

As illustrated in FIG. 16B, the ratio D2/D1 was 90.1% for R sub-pixels, 90.0% for G sub-pixels, and 89.8% for B sub-pixels.

As illustrated in FIG. 16C, film detachment occurred in the B sub-pixels in the display panel prepared for this observation. In other words, film detachment occurred only in the B sub-pixels, for which the ratio D2/D1 was smaller than 90.0%.

These results indicate that the risk of film detachment can be suppressed effectively by setting the ratio D2/D1 to be greater than or equal to 90.0% and smaller than or equal to 100%. That is, the risk of film detachment can be suppressed effectively by ensuring that the following relation is satisfied.

$$D1 \geq D2 \geq 0.90 \times D1 \qquad \text{(Mathematical Formula 4)}$$

In the above, description has been provided that when the distances D1 and D2 do not satisfy (Mathematical Formula 1) through (Mathematical Formula 3), it is considered that film detachment occurs, excluding an exceptional situation. This exceptional situation is when (Mathematical Formula 4) is satisfied.

However, the present inventor found that the risk of film detachment can be suppressed, even when (Mathematical Formula 4) is not satisfied. This is described in the following with reference to FIGS. 17A through 17C.

Figure 17A:
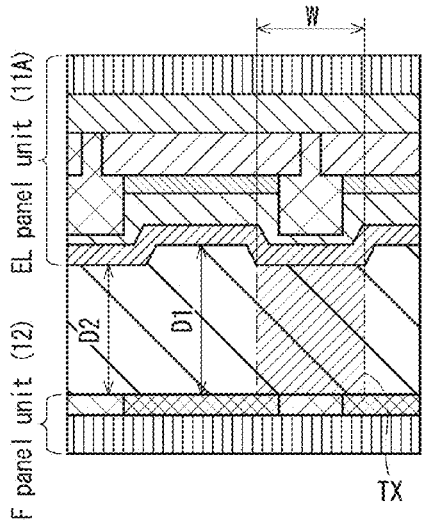
FIG. 17A is a schematic cross-sectional view illustrating a configuration of a display panel in which (Mathematical Formula 4) is satisfied.
Figure 17B:
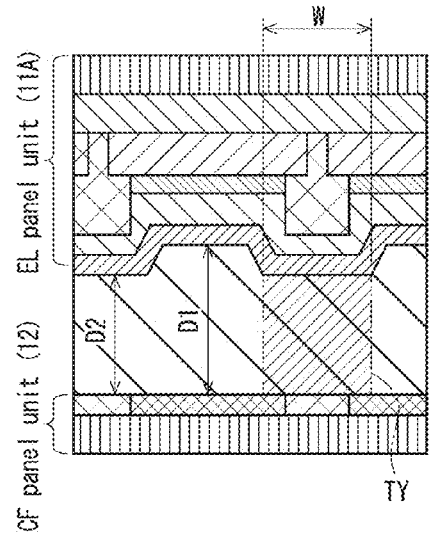
FIG. 17B is a schematic cross-sectional view illustrating a configuration of a display panel in which (Mathematical Formula 4) is not satisfied.

FIG. 17A is a schematic cross-sectional view illustrating a configuration of a display panel in which (Mathematical Formula 4) is satisfied, and FIG. 17B is a schematic cross-sectional view illustrating a configuration of a display panel in which (Mathematical Formula 4) is not satisfied. Distance D1 remains the same between the display panels illustrated in FIGS. 17A and 17B, but distance D2 varies between the display panels illustrated in FIGS. 17A and 17B. Specifically, distance D2 is longer in the display panel illustrated in FIG. 17A than in the display panel illustrated in FIG. 17B. Further, when denoting a cross-sectional area defined by distance D2 and width W in the display panel illustrated in FIG. 17A as TX, and denoting a cross-sectional area defined by distance D2 and width W in the display panel illustrated in FIG. 17B as TY, TX and TY satisfy TX>TY, due to the distance D2 varying between the two display panels as described above.

Figure 17C:
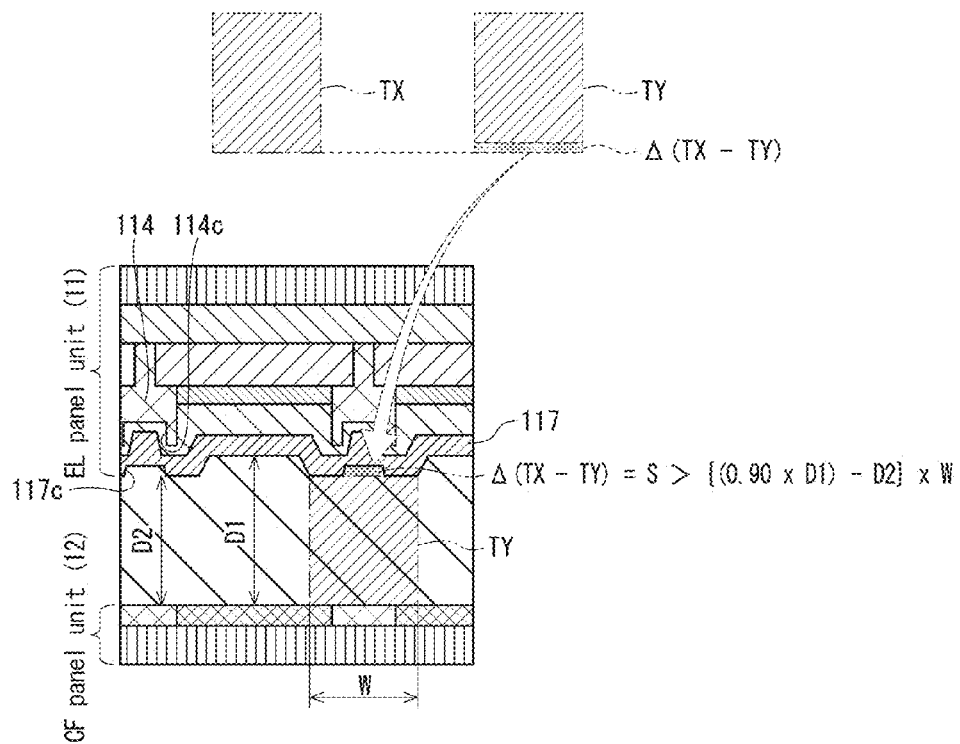
FIG. 17C is a view for explaining how the present inventor arrived at one aspect of the present invention.

FIG. 17C is a view for explaining how the present inventor arrived at one aspect of the present invention.

The present inventor considered that it may be possible to suppress the risk of film detachment occurring in a display panel in which (Mathematical Formula 4) is not satisfied by securing an space having the cross-sectional area Δ(TX−TY), which is the difference between the cross-sectional area TX and the cross-sectional area TY, at a different location of the display panel. That is, the present inventor considered that it may be possible to suppress the risk of film detachment even in a display panel in which the following relation is satisfied.

$$D2 < 0.90 \times D1 \quad \text{(Mathematical Formula 5)}$$

It is through such consideration that the present inventor, etc., arrived at a configuration of securing a space having the cross-sectional area Δ(TX−TY) by forming second recess portions 117c in the sealing layer 117, as illustrated in FIG. 17C. Further, the present inventor arrived at one aspect of the present invention considering that the second recess portions 117c can be easily formed by providing the banks 114 with the dents 114c.

Based on the above, the cross-sectional area S (FIG. 7) of the second recess portions 117c is no smaller than the cross-sectional area Δ(TX−TY). Here, the cross-sectional area Δ(TX−TY) can be calculated by multiplying width W and the difference between distance D2 in the display panel illustrated in FIG. 17A and distance D2 in the display panel illustrated in FIG. 17B. According to (Mathematical Formula 5) above, the difference between distance D2 in the display panel illustrated in FIG. 17A and distance D2 in the display panel illustrated in FIG. 17B is expressible as (0.90×D1)−D2 and is greater than zero. Accordingly, the cross-sectional area Δ(TX−TY) is expressible as {(0.90×D1)−D2}×W. Therefore, as illustrated in FIG. 17C, the risk of film detachment can be suppressed by making a configuration such that the cross-sectional area Δ(TX−TY), or that is, the cross-sectional area S of the second recess portions 117c satisfies the following relation.

$$S > \{(0.90 \times D1) - D2\} \times W \quad \text{(Mathematical Formula 6)}$$

(Mathematical Formula 1) above is satisfied when both (Mathematical Formula 5) and (Mathematical Formula 6) are satisfied.

[First Observation of where Film Detachment Occurs]

The following describes a first observation of where film detachment occurs, with reference to FIGS. 18A and 18B, FIG. 19, and FIG. 20.

Figure 18A:
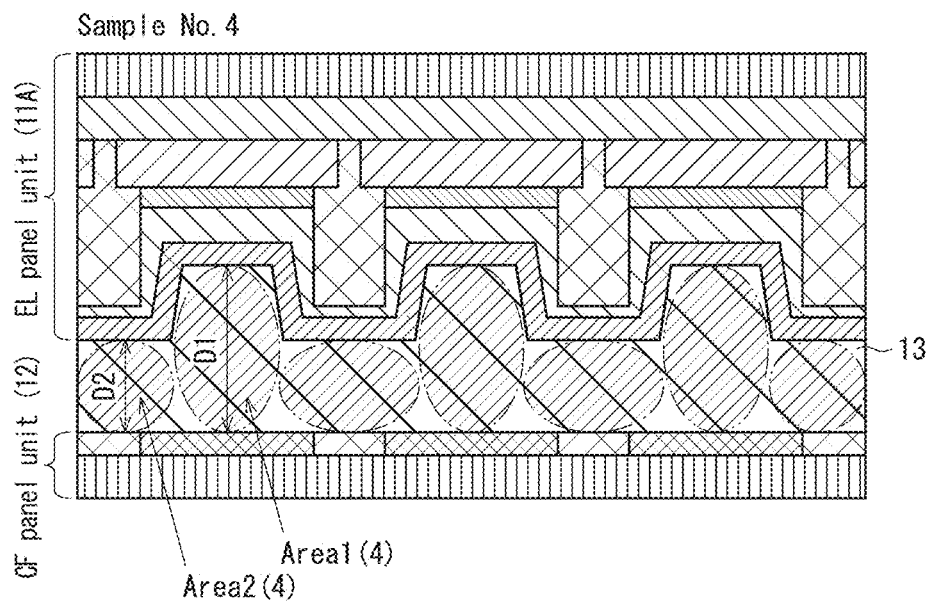
FIG. 18A is a schematic cross-sectional view illustrating, for sample No. 4, resin density distribution upon adhesion.

FIG. 18A illustrates the configuration of sample No. 4 used in the first observation of non-flatness level. In sample No. 4, the distance between the EL panel unit 11A and the main surface of the CF panel unit 12 is small at areas above the tops of the banks of the EL panel unit 11A (the areas are illustrated in FIG. 18A below the tops of the banks). These areas, referred to as areas 2(4) in FIG. 18A and in the following, are smaller in space than areas 1(4) corresponding to light-emitting areas. Due to this, at the point when the panel units are adhered together, the space available to resin is smaller at the areas 2(4) than at the areas 1(4), and thus, before providing resin with flowability, resin pressure at the areas 2(4) is greater than resin pressure at the areas 1(4).

Thus, when non-flowable resin is used for forming the sealing resin layer, such pressure difference occurs. Due to this, the provision of flowability to the resin generates resin flow from the areas 2(4) with high pressure to the areas 1(4) with low pressure.

Figure 18B:
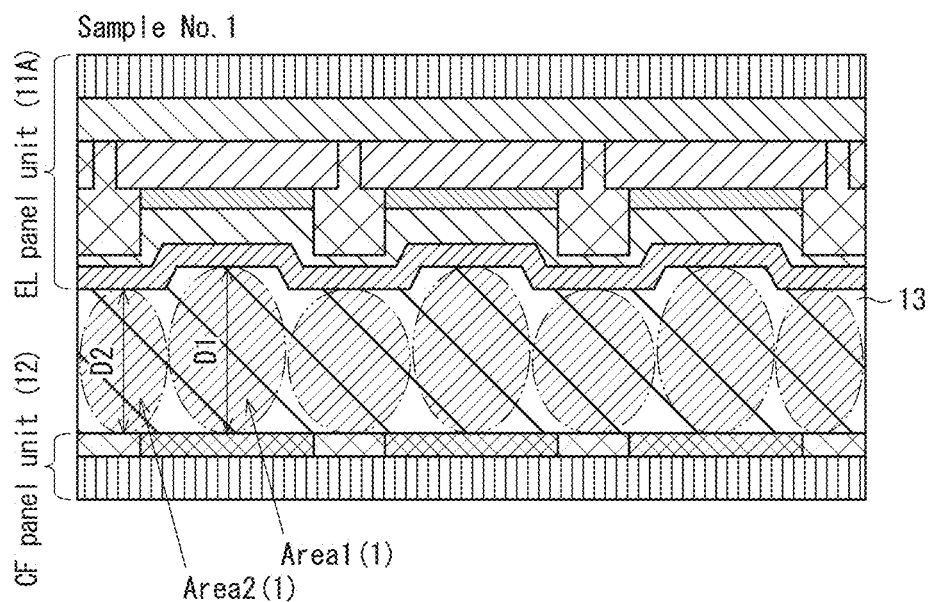
FIG. 18B is a schematic cross-sectional view illustrating, for sample No. 1, resin density distribution upon adhesion.

FIG. 18B illustrates the configuration of sample No. 1 used in the first observation of non-flatness level. The ratio in sample No. 1 of the space of area 2(1) to the space of area 1(1) is greater than the ratio in sample No. 4 of the space of area 2(4) to the space of area 1(4). Due to this, as already described above, the resin flow generated in sample No. 1 by the provision of flowability to the resin is not as rapid as that generated in sample No. 4 illustrated in FIG. 18A.

Figure 19:
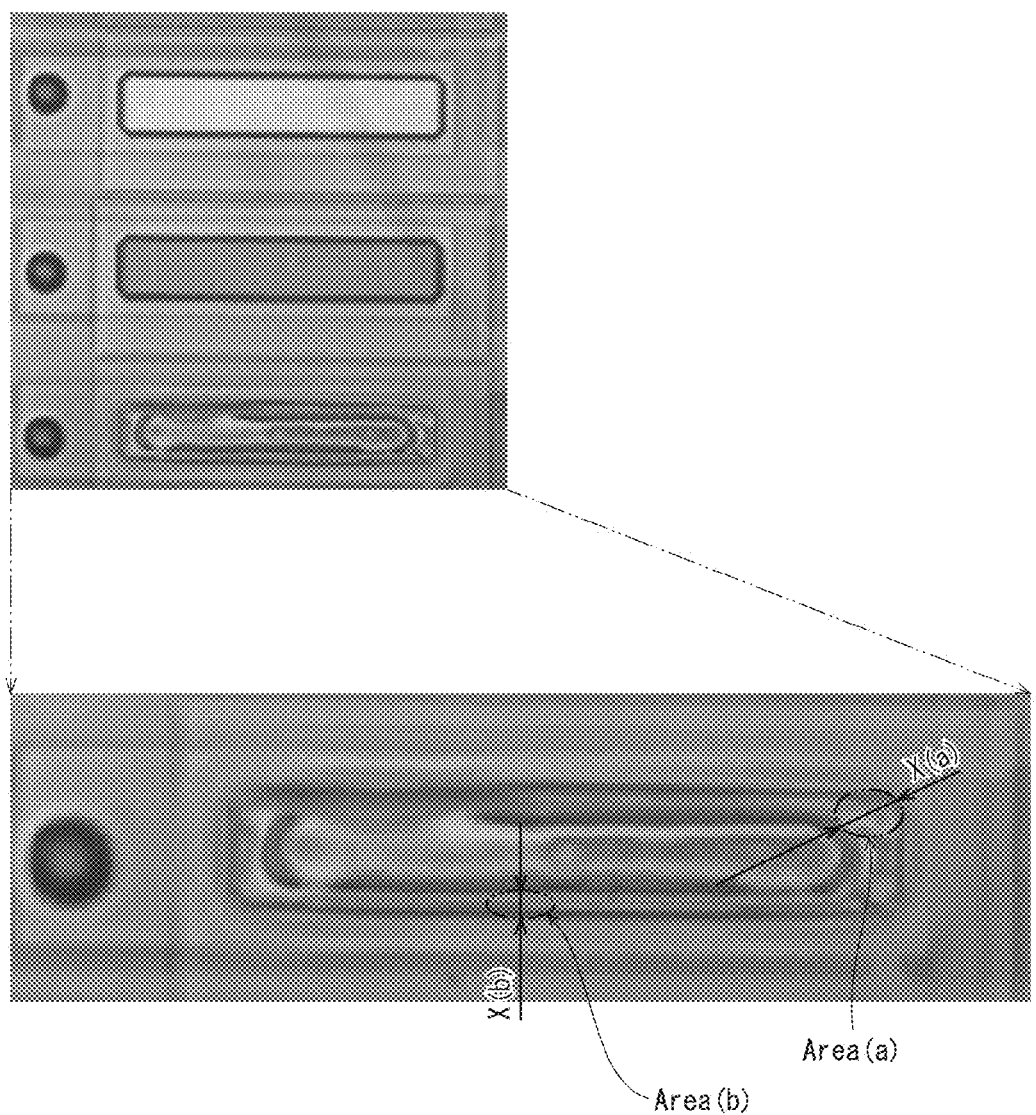
FIG. 19 is a view showing a sub-pixel in which film detachment caused by resin flow has occurred.

Further, as illustrated in the enlarged part of FIG. 19, observation of a sub-pixel in which film detachment caused by resin flow has occurred reveals that the movement amount of the detached film portion varies between different areas within the sub-pixel. In a sub-pixel having a rectangular shape in plan view as illustrated in FIG. 19, a movement amount X(a) in an area (a) near a corner of the sub-pixel is greater than a movement amount X(b) in an area (b) near the middle of a long edge of the sub-pixel.

This is due to there being a difference in resin flow amount (movement amount) between the area (a) and the area (b) upon adhesion of the panel units to one another.

Figure 20:
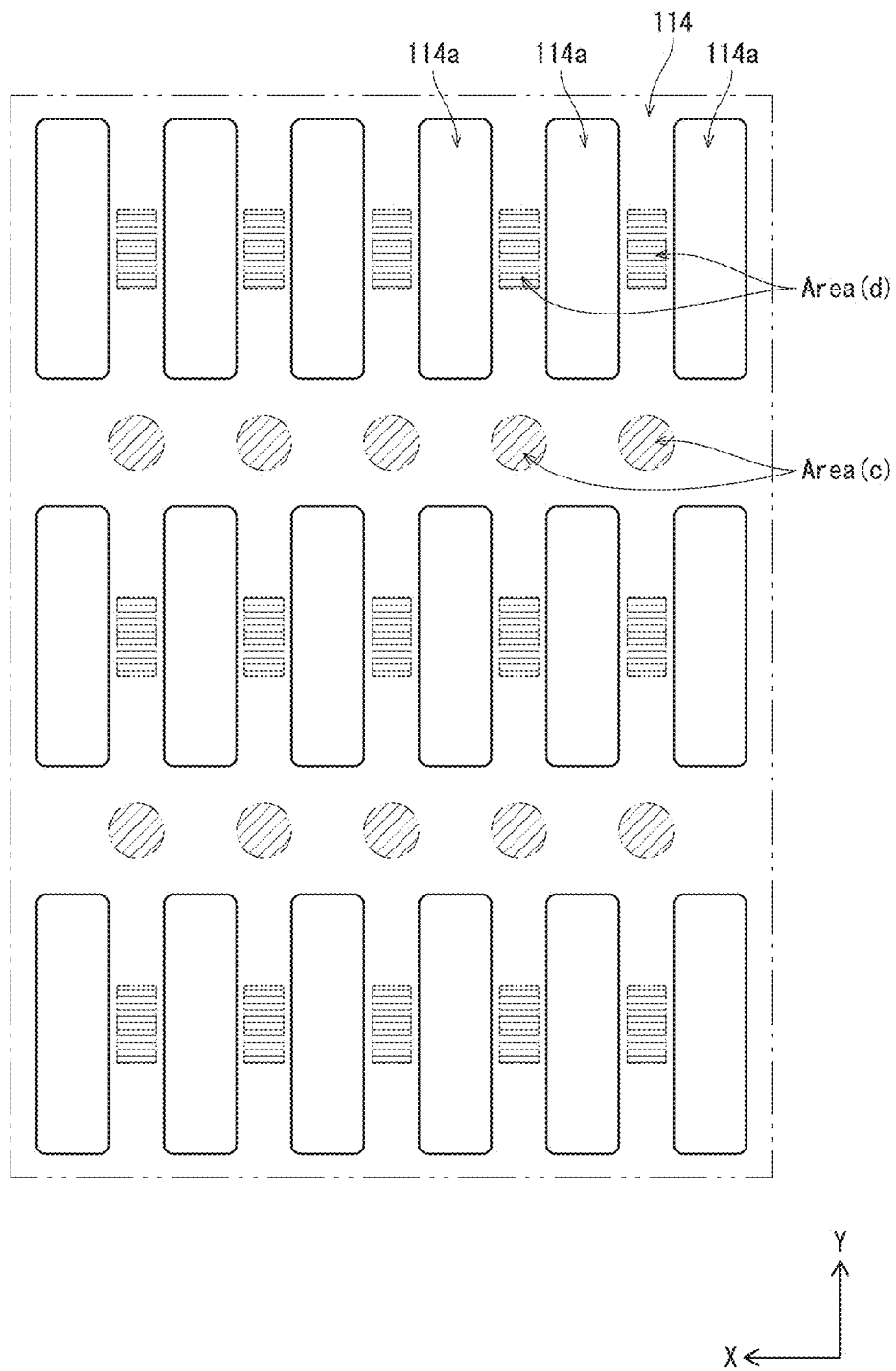
FIG. 20 is a schematic plan view illustrating a positional relation between areas (c) and areas (d) on banks 114.

Regarding resin flow, it is considered that the greater the difference in resin density between high density areas of the sealing resin layer and low density areas of the sealing resin layer, the greater the resin flow amount. That is, as illustrated in FIG. 20, it is considered that the difference in detached film portion movement amount described above is brought about because, after the EL panel unit 11A and the CF panel unit 12 are adhered together, resin density above lattice point areas (c) of the banks 114 forming a lattice structure differs from resin density above intermediate point areas (d) between the openings 114a.

[Second Observation of where Film Detachment Occurs]

The following describes a second observation of where film detachment occurs, with reference to FIGS. 21A through 21C, FIGS. 22A through 22F, and FIGS. 23A through 23C.

Figure 21B:
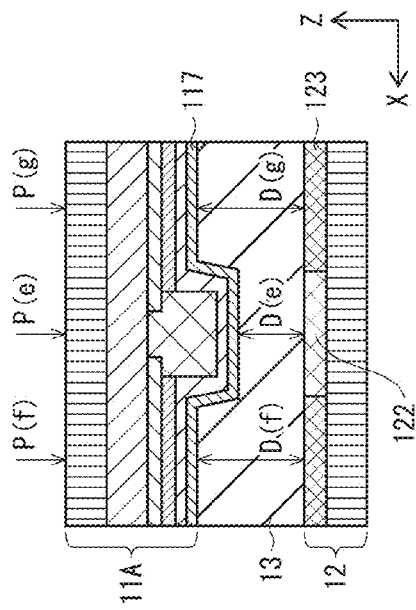
FIG. 21B is a schematic cross-sectional view taken along line S1-S2 in FIG. 21A.
Figure 21C:
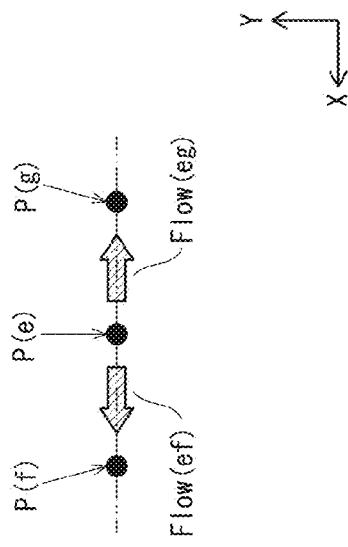
FIG. 21C is a schematic view illustrating a direction of resin flow between point P(e) and point P(f), and a direction of resin flow between point P(e) and point P(g).
Figure 21A:
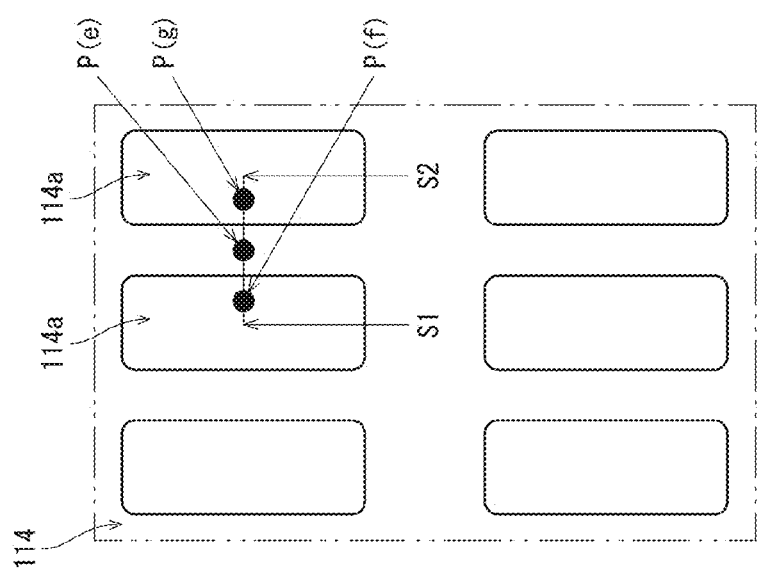
FIG. 21A is a schematic plan view illustrating a positional relation among points P(e), P(f), and P(g) on the banks 114.

As illustrated in FIG. 21A, in this observation, locations P(e), P(f) and P(g) were defined. Location P(e) is located at a top of a bank 114 between adjacent openings 114a, at an intermediate point area of the bank 114 in the longitudinal direction of the openings 114a (i.e., Y-axis direction). Location P(f) is located within an opening 114a to the left of location P(e) in the X-axis direction. Location P(g) is located within an opening 114a to the right of location P(e) in the X-axis direction.

As illustrated in FIG. 21B, distance D(e) between the EL panel unit 11A and the CF panel unit 12 at location P(e) is smaller than distance D(f) at location P(f) and distance D(g) at location P(g). Therefore, as illustrated in FIG. 21C, it is considered that resin, having been provided with flowability in the adhesion of the EL panel unit 11A and the CF panel unit 12 to one another, flows from an area corresponding to location P(e) to areas corresponding to locations P(f) and P(g) (flow (ef) and flow (eg)).

Specifically, variance in density distribution inside the non-flowable resin 130 is not yet generated in the states illustrated in FIGS. 22A and 22B. FIG. 22A illustrates a state where a protrusion portion 117a of the EL panel unit 11A has not yet come into contact with the main surface 130b of the non-flowable resin 130. FIG. 22B illustrates a state where the protrusion portion 117a has come into contact with the main surface 130b of the non-flowable resin 130 but has not yet stuck into the non-flowable resin 130. Note that in FIG. 22B, the gap between the first recess portion 117b of the EL panel unit 11A and the main surface 130b of the non-flowable resin 130 has a length $g_1$, which corresponds to the height of the top of the protrusion portion 117a from the bottoms of the first recess portions 117b of the EL panel unit 11A.

Next, as illustrated in FIG. 22C, the EL panel unit 11A is stuck into the non-flowable resin 130. As illustrated in FIG. 22C, when the gap between the first recess portion 117b of the EL panel unit 11A and the main surface 130b of the non-flowable resin 130 reaches length $g_2$ smaller than length $g_1$, the area inside the non-flowable resin 130 that corresponds to the location P(e) becomes a high density area dens1 in FIG. 22C.

Next, as illustrated in FIG. 22D, the EL panel unit 11A is stuck further into the non-flowable resin 130. As illustrated in FIG. 22D, when the gap between the first recess portion 117b of the EL panel unit 11A and the main surface 130b of the non-flowable resin 130 reaches length $g_3$ smaller than length $g_2$, the area inside the non-flowable resin 130 that corresponds to the location P(e) becomes a high density area dens 2 in FIG. 22D, which has even higher density.

When the EL panel unit 11A is stuck even further into the non-flowable resin 130 so that the gap between the first recess portion 117b and the main surface 130b becomes zero as illustrated in FIG. 22E, there is no longer any gap between the EL panel unit 11A and the non-flowable resin 130. In this state, the area inside the non-flowable resin 130 that corresponds to the location P(e) becomes a high density area dens3 in FIG. 22E. Here, note that since the non-flowable resin 130 has not been provided with flowability at this point, no resin flow occurs at this point.

Then, when flowability is provided to the non-flowable resin 130 through the application of light or heat as illustrated in FIG. 22F with the non-flowable resin 130 in the state illustrated in FIG. 22E, resin flow (indicated as flow(ef) and flow(eg) in FIG. 22F) occurs due to the variance in density distribution. Then, the sealing resin layer 13 is formed by curing the resin.

Further, as illustrated in FIG. 23A, locations P(h), P(i), P(j), and P(k) were defined. Location P(h) is located at a corner of one of the openings 114a defined by the banks 114. Locations P(i), P(j), and P(k) are each located on a top of a bank 114, with location P(i) located to the left of location P(h) in the X-axis direction, location P(j) located downward in the Y-axis direction from location P(h), and location P(k) located to the left of location P(j) in the X-axis direction.

As illustrated in FIG. 23B, distance D(h) between the EL panel unit 11A and the CF panel unit 12 at location P(h) is greater than distances D(i), D(j), and D(k) at locations P(i), P(j), and P(k), respectively. Therefore, as illustrated in FIG. 23C, it is considered that resin, having been provided with flowability in the adhesion of the EL panel unit 11A and the CF panel unit 12 to one another, flows from areas corresponding to locations P(i), P(j), and P(k) to an area corresponding to location P(h) (flow(ih), flow(jh), and flow(kh)). That is, as illustrated in FIG. 23C, resin flows into a corner of an opening 114a (the area corresponding to the location P(h)) from the areas corresponding to the locations P(i), P(j), and P(k).

According to the above observation, resin flow occurring when the resin is provided with flowability is greatly influenced by the difference in resin density between locations at different sides of a boundary between a light-emitting area (sub-pixel area) and a non-light-emitting area (area between sub-pixels). Specifically, the greater the resin density difference, the greater the resin flow amount. Therefore, when the resin is provided with flowability, greater resin flow occurs towards a corner of an opening 114a (the area corresponding to location P(h)) than towards intermediate point areas of an opening 114a in the longitudinal direction (the areas corresponding to locations P(f) and P(g)).

As such, detached film portion movement caused by resin flow is greater at area (a) in FIG. 19 than at area (b) in FIG. 19.

[Modifications]

Figure 24A:
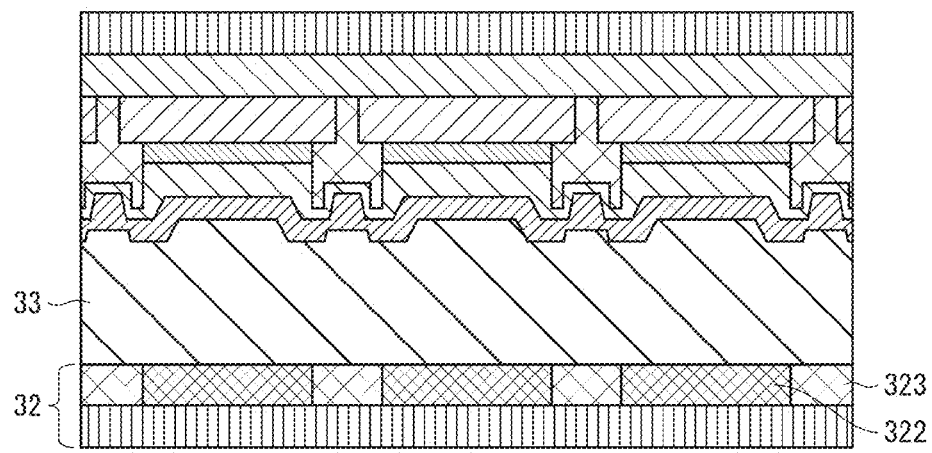
FIG. 24A is a schematic cross-sectional view illustrating a configuration of a display panel according to modification 1.
Figure 24B:
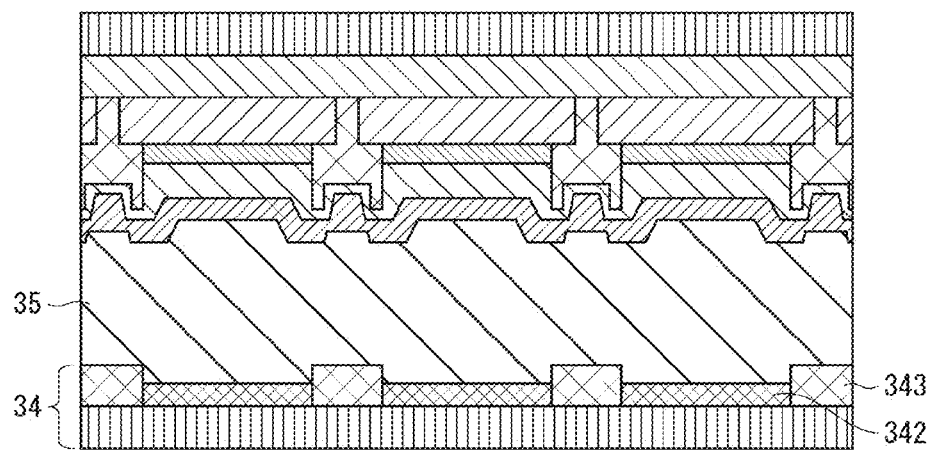
FIG. 24B is a schematic cross-sectional view illustrating a configuration of a display panel according to modification 2.
Figure 24C:
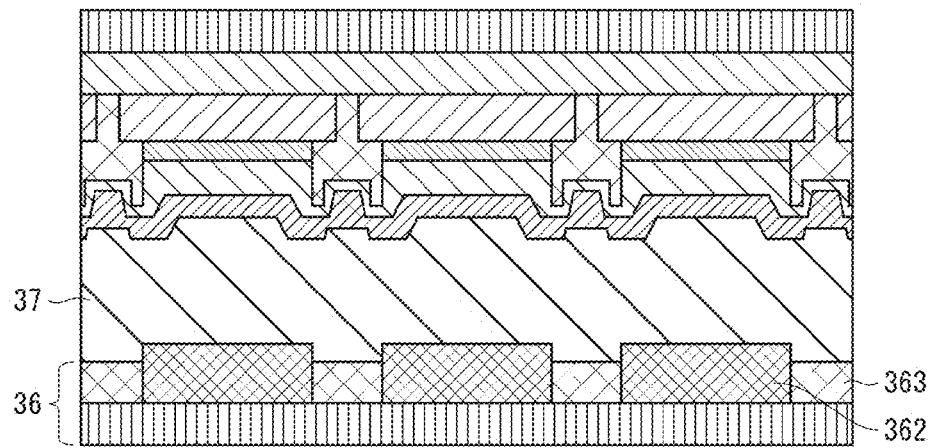
FIG. 24C is a schematic cross-sectional view illustrating a configuration of a display panel according to modification 3.

(1) FIG. 24A illustrates a modification in which the height of BM layers 323 and the height of CF layers 322 of a CF panel unit 32 are equal to each other, and a main surface of the CF panel unit 32 that is in contact with a sealing resin layer 33 is substantially flat. FIG. 24B illustrates a modification in which the height of CF layers 342 of a CF panel unit 34 is lower than the height of BM layers 343, and a main surface of the CF panel unit 34 that is in contact with a sealing resin layer 35 is a non-flat surface as a whole. FIG. 24C illustrates a modification in which the height of CF layers 362 of a CF panel unit 36 is higher than the height of BM layers 363, and a main surface of the CF panel unit 364 that is in contact with a sealing resin layer 37 is a non-flat surface as a whole.

By configuring the modifications illustrated in FIGS. 24A, 24B, and 24C so that (Mathematical Formula 1) to (Mathematical Formula 3) described above are satisfied, resin flow and the consequent occurrence of film detachment can be reduced or eliminated.

Figure 25:
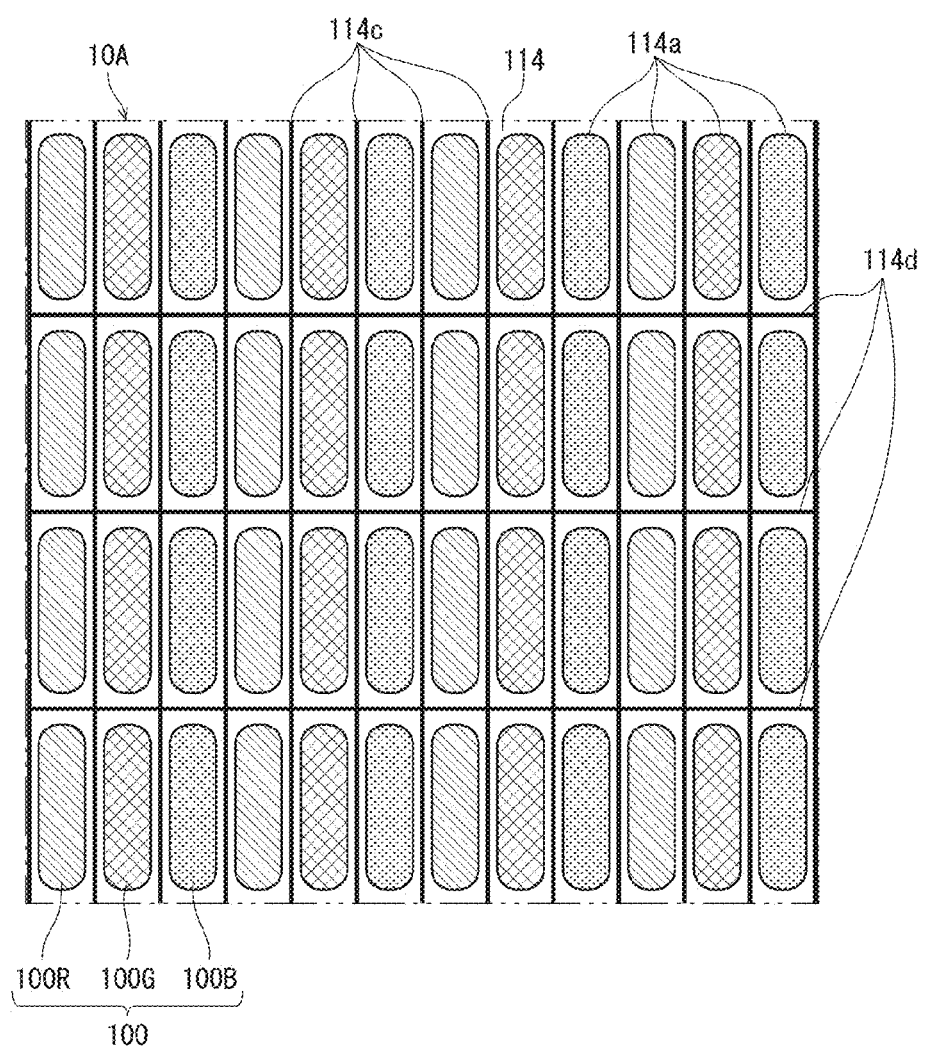
FIG. 25 is a schematic plan view illustrating a pixel configuration in a display panel 10A according to a modification.

(2) In the embodiment, as illustrated in FIGS. 2 and 3, dents 114c extending in the Y-axis direction are formed in the banks 114. In addition to such dents 114c extending in the Y-axis direction, dents 114d extending in the X-axis direction may be formed. FIG. 25 illustrates a display panel 10A including both the dents 114c and the dents 114d.

(3) In the embodiment, description is provided of an example where one aspect of the present invention is applied to a display panel with a pixel bank structure, where sub-pixels are surrounded by banks 114 forming a lattice structure. However, one aspect of the present invention may also be applied to a line bank structure. FIG. 26 illustrates a display panel 40 having a line bank structure, where line banks 414 define lines of sub-pixels. In the display panel 40, sub-pixels 400R adjacent to one another in the Y-axis direction are partitioned from one another by an electrical insulation film 401. Similarly, in the display panel 40, sub-pixels 400G adjacent to one another in the Y-axis direction are partitioned from one another by an electrical insulation film 401, and sub-pixels 400B adjacent to one another in the Y-axis direction are partitioned from one another by an electrical insulation film 401. Further, in the display panel 40, each set of sub-pixels 400R, 400G, 400B adjacent in the X-axis direction composes one pixel 400. Further, in the display panel 40, each line bank 414 has a dent 414c formed therein. The dents 414c extend in the Y direction, as do the line banks 414. These dents 414c allow second recess portions to be formed thereabove in the sealing layer.

[Other Matters]

The embodiment, etc., above describe examples based on top-emission-type organic EL display devices. However, the configurations described above may also be applied to bottom-emission-type organic EL display panels.

In addition, the shape, the constituent material, and the like of each member illustrated in the above embodiment are examples, and the present invention is not limited to them. For example, in the embodiment, etc., one of the two panel units is a CF panel unit including color filters. However, the two panel units need not include a CF panel unit. For example, a configuration similar to that described above can be realized by replacing the CF panel unit with a substrate that is formed of glass, resin, or the like and configuring one surface of the substrate as a non-flat surface or a flat surface.

Further, as illustrated in FIG. 2 and the like, the embodiment describes a configuration where a plurality of light-emitting areas (sub-pixels) are arranged to form a matrix shape in plan view. However, the light-emitting areas need not be arranged in such a manner. For example, the light-emitting areas may be arranged to form a honeycomb structure.

Further, in the embodiment, etc., the distances D1 and D2 are changed by changing the height of the banks of the EL panel unit. However, the distances D1 and D2 need not be changed by changing the height of the banks. For example, the distances D1 and D2 can be changed, for example, by providing recesses/protrusions to a base surface of the substrate or by providing the surface of the interlayer electrical insulation layer with recesses/protrusions. Alternatively, the distances D1 and D2 can be changed, for example, by providing recesses/protrusions to the sealing layer.

Further, in the embodiment, the dents 114c in the banks 114 are formed by using a photomask having halftone windows. However, bank dents need not be formed in such a manner. For example, the banks 114 may be provided with the dents 114c, by providing the banks 114 with a two-layer structure composed of a first bank layer without any dents and a second bank layer formed at positions corresponding to lateral walls of the dents 114c. With such a two-layer structure, the banks 114 have dents when seen as a whole.

Further, the process of adhering the EL panel unit and the CF panel unit together via the non-flowable resin need not be performed under a reduced-pressure atmosphere. For example, a modification may be made such that gaps between the non-flowable resin and the panel units are eliminated by first performing the adhesion under atmospheric pressure or the like, and then pressing the EL panel unit and the CF panel unit together.

Further, the present invention is not only applicable to organic EL display panel, and may be applied to various other types of display panels, in which case the same effects as described above can be achieved.

INDUSTRIAL APPLICABILITY

The present invention is useful for achieving a display panel with high image quality.

REFERENCE SIGNS LIST

1 Display device
10 Display panel
11 EL panel unit
12, 32, 34, 36 CF panel unit
13, 33, 35, 37 Sealing resin layer
20 Drive control unit
21-24 Drive circuit
25 Control circuit
100 pixel
100R R sub-pixel
100G G sub-pixel
100B B sub-pixel
111 TFT substrate
112 Interlayer electrical insulation layer
113 Anode
114 Bank
115 Organic light-emitting layer
115R R organic light-emitting layer
115G G organic light-emitting layer
115B B organic light-emitting layer
116 Cathode
117 Sealing layer
117a Protrusion portion
117b First recess portion
117c Second recess portion
121 Substrate
122, 322, 342, 362 Color filter layer
122R R color filter layer
122G G color filter layer
122B B color filter layer
123, 323, 343, 363 Black matrix layer
130 Non-flowable resin
131a, 131b Laminate film
500 Mask
1130 Metal thin film
1140 Bank material layer
1141 Photomask
1230 BM material layer

The invention claimed is:

1. A display panel comprising:
a first panel unit (i) including a substrate and a film body disposed on at least a part of one surface of the substrate, (ii) having two main surfaces, one of which including a surface of the film body is referred to as a first main surface, and (ii) including, in plan view, a light-emitting area and a non-light-emitting area disposed next to one another;
a second panel unit disposed to face the first main surface with a space therebetween, one main surface of the second panel unit facing the first main surface being referred to as a second main surface; and
a sealing resin layer disposed in the space between the first panel unit and the second panel unit and in contact with both the first main surface and the second main surface, wherein
the first main surface, as a whole, is a non-flat surface, with a first recess portion corresponding to the light-emitting area, a protrusion portion corresponding to the non-light-emitting area, and a second recess portion disposed in a top part of the protrusion portion, and
$D2 < 0.90 \times D1$ and $S > \{(0.90 \times D1) - D2\} \times W$ are satisfied, where
D1 denotes a distance between a bottom surface of the first recess portion and the second main surface;

D2 denotes a distance between a top surface of the protrusion portion and the second main surface;

W denotes a width of the top surface of the protrusion portion in one direction in which the light-emitting area and the non-light emitting area are disposed next to one another; and S denotes an area of a cross-section of the second recess portion taken along a plane defined by the one direction and a direction perpendicular to the first main surface.

2. The display panel according to claim 1, wherein
the second main surface, as a whole, is a non-flat surface, with a top part of a protrusion portion protruding further towards the first panel unit compared to a bottom part of a recess portion.

3. The display panel according to claim 2, wherein
the recess portion of the second main surface is located within an area of the second panel unit that, in plan view, corresponds to the non-light-emitting area of the first panel unit.

4. The display panel according to claim 2, wherein
the protrusion portion of the second main surface is located within an area of the second panel unit that, in plan view, corresponds to the non-light-emitting area of the first panel unit.

5. The display panel according to claim 1, wherein
the second panel unit is a color filter panel including:
 a substrate;
 a color filter layer formed on the substrate; and
 a black matrix layer formed adjacent to the color filter layer.

6. A method of manufacturing a display panel, comprising
preparing a first panel unit (i) including a substrate and a film body disposed on at least a part of one surface of the substrate, (ii) having two main surfaces, one of which including a surface of the film body is referred to as a first main surface, and (ii) including, in plan view, a light-emitting area and a non-light-emitting area disposed next to one another;

preparing a second panel unit;

adhering non-flowable resin onto one main surface of the second panel unit, said one main surface of the second panel unit referred to as a second main surface;

adhering the first main surface onto one of main surfaces of the non-flowable resin that is opposite the other one of the main surfaces of the non-flowable resin onto which the second panel unit has been adhered; and forming a sealing resin layer by applying heat or light with respect to the non-flowable resin to yield resin with flowability, and curing the resin with flowability, wherein the first main surface, as a whole, is a non-flat surface, with a first recess portion corresponding to the light-emitting area, a protrusion portion corresponding to the non-light-emitting area, and a second recess portion disposed in a top part of the protrusion portion, the sealing resin layer is in contact with both the first main surface and the second main surface, and $D2 < 0.90 \times D1$ and $S > \{(0.90 \times D1) - D2\} \times W$ are satisfied, where D1 denotes a distance between a bottom surface of the first recess portion and the second main surface;

D2 denotes a distance between a top surface of the protrusion portion and the second main surface;

W denotes a width of the top surface of the protrusion portion in one direction in which the light-emitting area and the non-light emitting area are disposed next to one another; and S denotes an area of a cross-section of the second recess portion taken along a plane defined by the one direction and a direction perpendicular to the first main surface.

7. The method of claim 6, wherein
the adhesion of the second main surface and the non-flowable resin and the adhesion of the first main surface and the non-flowable resin are conducted under a reduced-pressure atmosphere, and when having been put in adhesion with the first and second main surfaces, the non-flowable resin is in contact with the entire first main surface, including the top surface of the protruding portion and the bottom surface of the recess portion, and with the entire second main surface.

* * * * *